(12) United States Patent
Aikawa et al.

(10) Patent No.: US 6,496,430 B2
(45) Date of Patent: Dec. 17, 2002

(54) SEMICONDUCTOR MEMORY CIRCUIT HAVING SELECTIVE REDUNDANT MEMORY CELLS

(75) Inventors: Tadao Aikawa, Kawasaki (JP); Takaaki Suzuki, Kawasaki (JP); Yasuharu Sato, Kawasaki (JP); Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/131,221

(22) Filed: Apr. 25, 2002

(65) Prior Publication Data

US 2002/0114201 A1 Aug. 22, 2002

Related U.S. Application Data

(62) Division of application No. 09/385,012, filed on Aug. 27, 1999, now Pat. No. 6,400,617.

(30) Foreign Application Priority Data

Sep. 2, 1998 (JP) .......................................... 10-248819

(51) Int. Cl.[7] ................................................ G11C 29/00
(52) U.S. Cl. ............. 365/200; 365/230.06; 365/230.03; 365/233; 365/225.7; 365/63
(58) Field of Search ........................... 365/233, 230.03, 365/230.06, 200, 189.12, 225.7, 63

(56) References Cited

U.S. PATENT DOCUMENTS

| | | | |
|---|---|---|---|
| 4,656,610 A | | 4/1987 | Yoshida et al. ............. 365/200 |
| 4,918,662 A | * | 4/1990 | Kondo ........................ 365/210 |
| 5,021,944 A | * | 6/1991 | Sasaki et al. ............... 365/200 |
| 5,355,339 A | * | 10/1994 | Oh et al. ..................... 365/200 |
| 5,379,259 A | | 1/1995 | Fujita ......................... 365/200 |
| 5,416,740 A | | 5/1995 | Fujita et al. ................. 365/200 |
| 5,487,050 A | * | 1/1996 | Kim et al. ............. 365/230.06 |
| 5,508,963 A | | 4/1996 | Sawada et al. ............. 365/200 |
| 5,548,555 A | * | 8/1996 | Lee et al. .................... 365/200 |
| 5,673,227 A | | 9/1997 | Engles et al. ............... 365/200 |
| 5,808,944 A | * | 9/1998 | Yoshitake et al. .......... 365/200 |
| 5,859,801 A | | 1/1999 | Poechmueller .............. 365/200 |
| 5,914,907 A | | 6/1999 | Kobayashi et al. .... 365/230.03 |
| 6,097,643 A | | 8/2000 | Hasegawa ................... 365/200 |

\* cited by examiner

*Primary Examiner*—Andrew Q. Tran
(74) *Attorney, Agent, or Firm*—Arent Fox Kintner Plotkin & Kahn, PLLC

(57) ABSTRACT

A semiconductor memory circuit includes a plurality of memory cell arrays arranged in rows and columns. A decoder circuit selects a predetermined number of memory cell arrays from among the plurality of the memory cell arrays. Sense amplifiers sense data read from selected memory cell arrays. The plurality of memory cell arrays are grouped into a first type of memory cell arrays each having a redundant memory cell and a second type of memory cell arrays each having no redundant memory cell.

10 Claims, 21 Drawing Sheets

SEMICONDUCTOR MEMORY CIRCUIT HAVING SELECTIVE REDUNDANT MEMORY CELLS

This is a Division of application No. 09/385,012 filed Aug. 27, 1999, now U.S. Pat. No. 6,400,617. The disclosure of the prior application(s) is hereby incorporated by reference herein in its entirety.

BACKGROUND OF THE INVENTION

1. Field of the Invention

The present invention generally relates to semiconductor memory circuits, and more particularly to a semiconductor memory circuit which operates in synchronism with a clock signal.

Nowadays, a central processing unit (CPU) operates at a high speed, and a semiconductor circuit such as a dynamic random access memory (DRAM) is thus required to perform a data input/output operation at a high frequency and speed up a data transfer. As semiconductor memory circuits capable of satisfying such a requirement, there are known a synchronous dynamic random access memory (SDRAM) and a fast cycle random access memory (FCRAM), which memories operate in synchronism with a clock signal supplied from the outside of the circuits.

However, the above semiconductor circuits tend to need an increased chip area in accordance with an increase in the circuit scale and the memory capacity due to the speeding up of the data transfer speed. Hence, it is required to provide a semiconductor memory circuit having a reduced chip area without decreasing the memory capacity.

2. Description of the Prior Art

A description will now be given of a conventional semiconductor memory circuit such as a DRAM.

FIG. 1 is a block diagram of a conventional semiconductor memory circuit, which includes memory cell arrays 201–208, and sense amplifier groups 209–212. The memory cell arrays 201–208 are arranged in rows and columns in a matrix formation. In the circuit shown in FIG. 1, eight memory cell arrays 201–208 are arranged in two rows and four columns. The sense amplifier groups 209–212 receive and hold data read from memory cells selected by main word decoders MWD and sub word decoders SWD. Further, the memory circuit has redundant cells 213a–213d and 214a–214d respectively associated with the memory cell arrays 201–208, and is thus saved from a fault such as a fault of a memory cell or a defect of a column select signal. Each of the memory cell arrays 201–208 has memory cells arrayed in a matrix formation of 16 rows and 4 columns.

FIG. 2 is an enlarged block diagram of the part of the memory circuit indicated by a broken-line circle shown in FIG. 1. In FIG. 2, S/A denotes a sense amplifier, CL denotes a column select line, DB_SW denotes a data bus switch, MWL denotes a main word line, SWL denotes a sub word line, GDB00X,Z denotes a pair of global data bus lines, and b11x,z and b12x,z denote pairs of bit lines.

All the memory cell arrays in the column direction selected by the main word line MWL extending from the main word decoder MWD are enabled. In FIG. 1, such all the memory cell arrays are illustrated with hatching. Then, the sub word line extending from one of the sub word decoders SWD is enabled, and data stored in the memory cells connected to the enabled memory cells are output to the corresponding sense amplifiers S/A. The data sensed and held by the sense amplifiers S/A are read from the sense amplifiers selected by the column select line CL, and are then output to the outside of the memory circuit via the (local) data bus DB, the data bus switch DB_SW, and the global data bus GDB00X,Z. If there is a fault in the data bus related to the memory cell array which is enabled, for example, the memory cell array 201, the defective column select line corresponding to the fault is replaced by a redundant column select line for selecting the redundant cell 213a. Thus, the circuit can be saved from the fault.

However, the arrangement shown in FIGS. 1 and 2 does not allow a large number of pairs of global data bus lines along the sides of the memory cell arrays. The above fact does not satisfy a high-speed, multiple-bit data outputting requirement. Further, all the memory cell arrays in the column direction are all enabled at once by the main word line MWL, which is thus burdened heavily. If a power supply voltage drops, the circuit will be forced to operate at a reduced speed.

With the above in mind, an improved semiconductor memory circuit has been proposed in which the memory cell arrays are designed to have a reduced size, and a reduced number of memory cells is activated at one time. In other words, such an improved memory circuit has main word lines arranged in a distributed fashion.

FIG. 3 is a block diagram of such an improved semiconductor memory circuit capable of outputting data in a multiple-bit formation. The circuit shown in FIG. 3 includes 16 memory cell arrays 221–236 arranged in four rows and four columns, and sense amplifier groups 237–240 which receive and hold data from memory cells selected by the main word decoder MWD and the sub word decoders SWD. Further, redundant memory cells 241a–241d, 242a–242d, 243a–243d, and 244a–244d are respectively provided to the memory cell arrays 221–236. Each of the memory cell arrays 221–236 includes memory cells arrayed in eight rows and four columns. That is, the number of memory cells provided in each of the memory cell arrays 221–236 is half that of memory cells provided in each of the memory cell arrays 201–208 shown in FIG. 1.

As shown in FIG. 3, four memory cell arrays 221, 226, 231 and 236 illustrated with hatching and located in mutually different row and columns are all enabled at once by four main word lines extending from the main word decoder MWD. Then, data stored in all memory cells selected by the sub word lines extending from the sub word decoders SWD are output to the sense amplifiers. The data latched in the sense amplifiers are read from sense amplifiers selected by the column select lines CL extending along the sides of the memory cell arrays, and are then output to the outside of the circuit via the data bus provided on the memory cell arrays. If a fault exists in one of the memory cell arrays which are enabled, for example, the memory cell array 221, the defective column select line corresponding to the related data is replaced by a column select line for selecting the redundant cell 241a. Thus, the circuit can be saved from the fault.

As described above, each memory cell array has a reduced size and the main word lines extending from the main word decoder are respectively provided to the columns. Hence, each of the main word lines has a reduced load. The redundant memory cells are respectively provided to the memory cell arrays 221–236, so that the redundant efficiency can be improved.

However, the semiconductor memory circuit shown in FIG. 3 needs a large chip size because the redundant memory cells are respectively provided to the memory cell arrays 221–236. Hence, a very large chip area is needed to increase the memory capacity.

SUMMARY OF THE INVENTION

It is a general object of the present invention to provide a semiconductor memory circuit in which the above disadvantages are eliminated.

A more specific object of the present invention is to provide a semiconductor memory circuit having a reduced chip size without degrading the redundant efficiency.

The above objects of the present invention are achieved by a semiconductor memory circuit comprising the following. A plurality of memory cell arrays are arranged in rows and columns. A decoder circuit selects a predetermined number of memory cell arrays from among the plurality of the memory cell arrays. Sense amplifiers sense data read from selected memory cell arrays. The plurality of memory cell arrays are grouped into a first type of memory cell arrays each having a redundant memory cell and a second type of memory cell arrays each having no redundant memory cell.

The above objects of the present invention are also achieved by a semiconductor memory circuit including the following. A plurality of memory cell arrays are arranged in rows and columns. A decoder circuit selects a predetermined number of memory cell arrays from among the plurality of the memory cell arrays. Sense amplifiers sense data read from selected memory cell arrays. Redundant memory cell arrays are respectively provided to the rows.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of a semiconductor memory circuit according to a first embodiment of the present invention.

Figure 4:
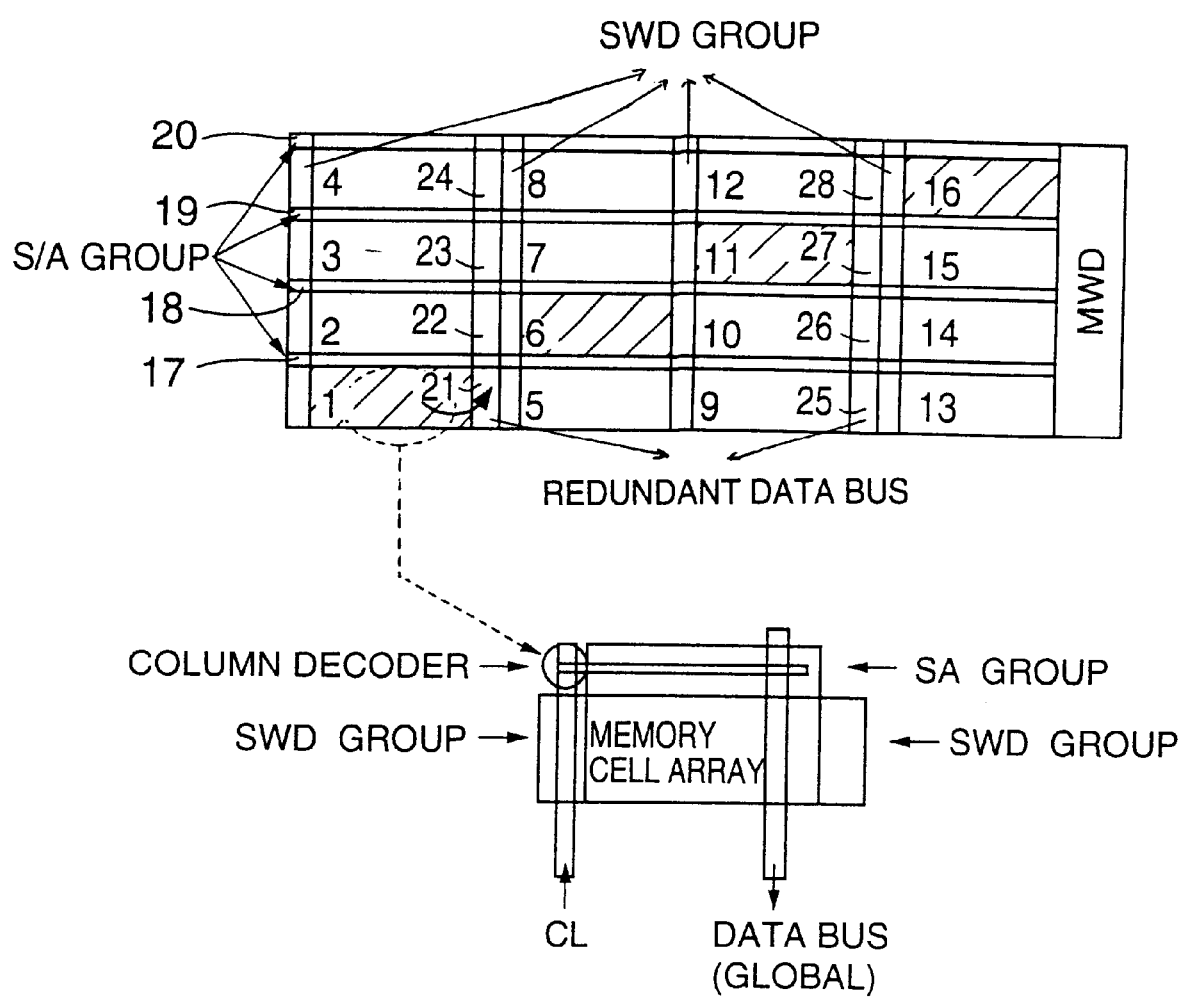
FIG. 4 is a block diagram of a structure of a memory cell array employed in a semiconductor memory circuit according to a first embodiment of the present invention.

FIG. 4 is a block diagram of a semiconductor memory circuit capable of outputting multiple bits at a high speed. The memory circuit shown in FIG. 4 includes 16 memory cell arrays 1–16 arrayed in four rows and four columns, and sense amplifier groups 17–20.

Redundant memory cells 21–24 are respectively provided in the memory cell arrays 1–4, and redundant memory cells 25–28 are respectively provided in the memory cell arrays 9–12. The memory cell arrays 1–4 and 9–12 are of a first type. On the other hand, no redundant cells are specifically provided in the memory cell arrays 5–8 and 13–16, which are of a second type. The eight redundant memory cells 21–28 save the memory circuit from a fault such as a faulty memory cell or a defective column select signal related to the 16 memory cell arrays 1–16. Each of the memory cell arrays 1–16 includes memory cells arrayed in four rows and four columns. The number of memory cell arrays and the number of memory cells in each of the memory cell arrays are not limited to the above-mentioned numbers, but an arbitrary number of memory cell arrays and an arbitrary number of memory cells in each memory cell array can be employed.

Figure 5:
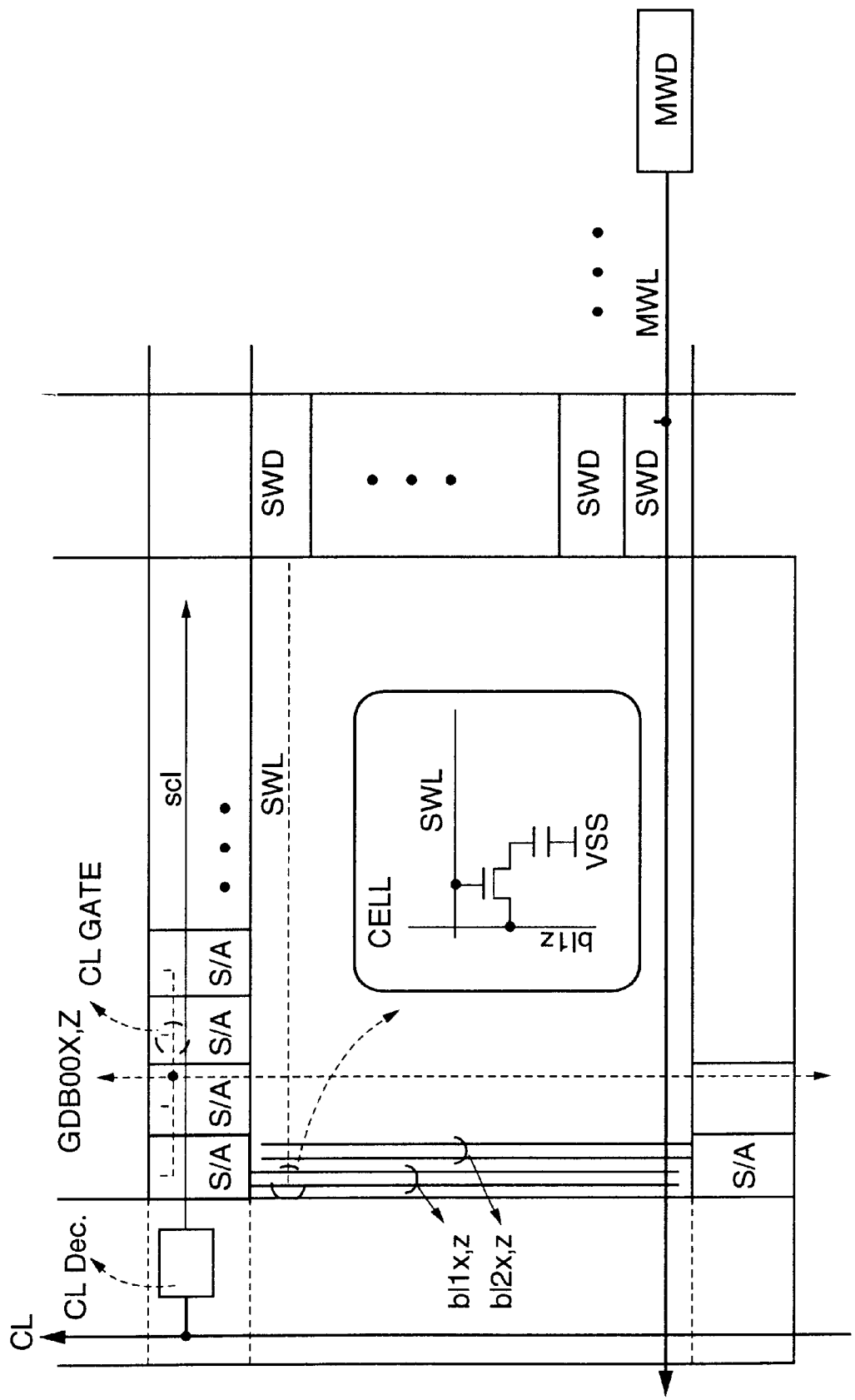
FIG. 5 is an enlarged view of a part of the semiconductor memory circuit shown in FIG. 4.

FIG. 5 is an enlarged block diagram of a part illustrated by a broken-line circle shown in FIG. 4. A column decoder CL_Dec is connected to the column select line CL. A signal line scl carrying a decoded column select signal generated by the column decoder CL_Dec extends above the sense amplifiers. The pairs of global data buses such as GDB00X,Z extend above the memory cell array. The sense amplifiers are arranged along two opposing sides of the memory cell array, and the pairs of bit lines alternately extend from the sense amplifiers arranged along the opposing sides.

Figure 6:
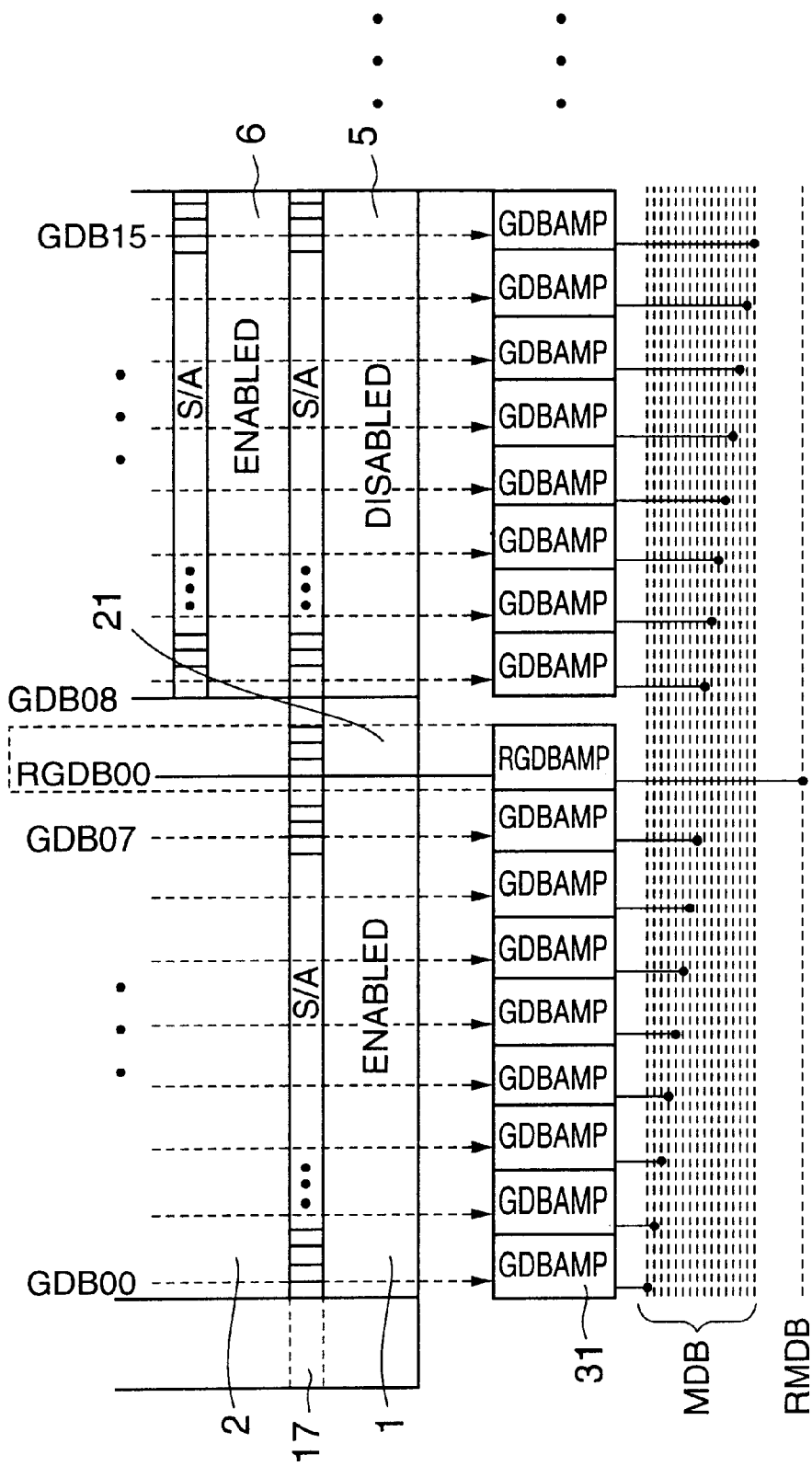
FIG. 6 is a block diagram of a structure of a memory cell array employed in the first embodiment of the present invention.
Figure 7:
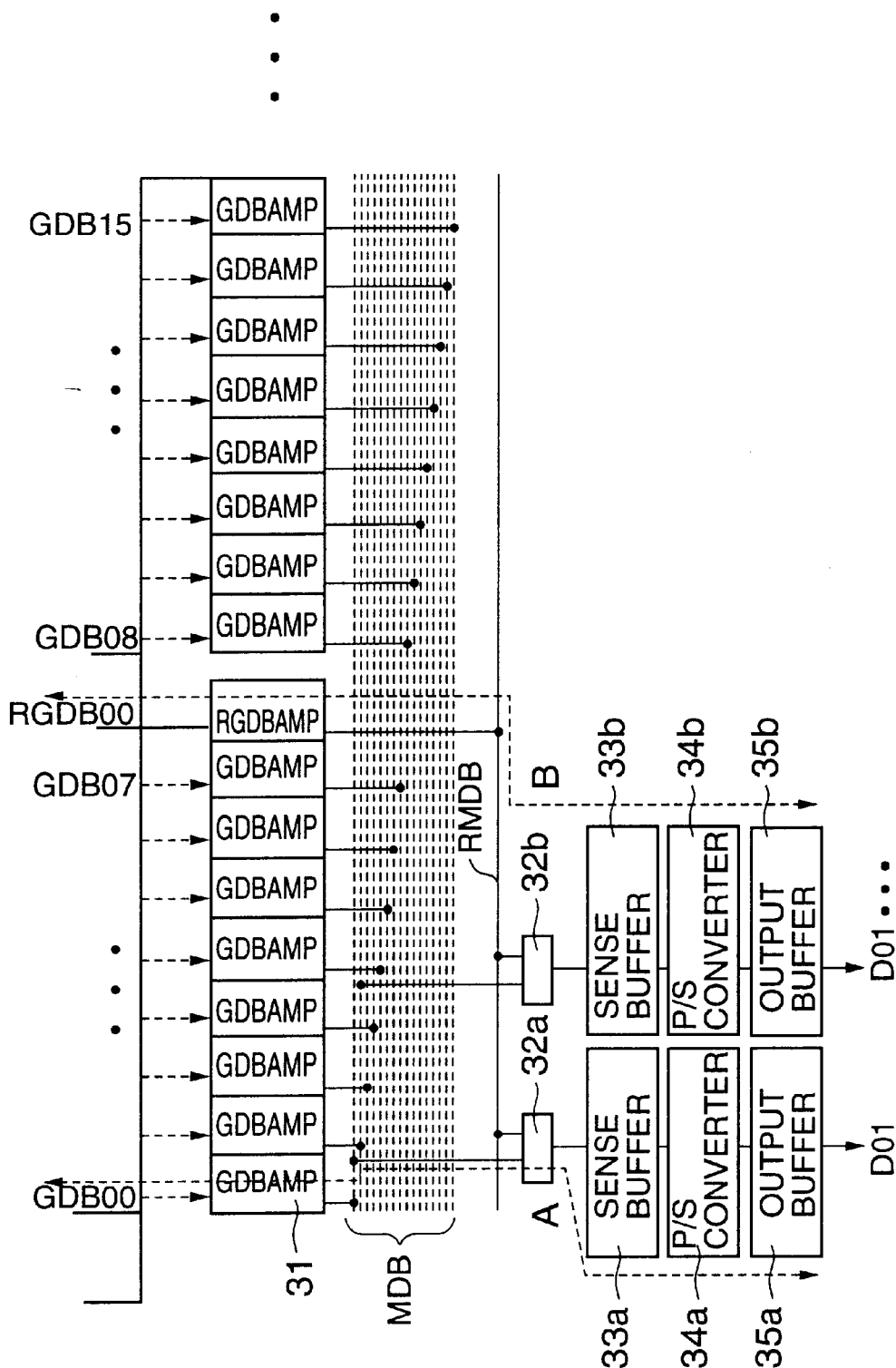
FIG. 7 is a block diagram of peripheral circuits of a main data bus employed in the first embodiment of the present invention.

A description will now be given, with reference to FIGS. 4 through 7, of an operation of the semiconductor memory circuit according to the first embodiment of the present invention. FIG. 6 is a block diagram of a structure of the memory cell arrays used in the first embodiment of the present invention, and FIG. 7 is a block diagram of a data output part employed in the first embodiment thereof.

First, four memory cell arrays are all enabled at once by driving the four main word lines extending from the main word decoder MWD. For example, the memory cell arrays 1, 6, 11 and 16 illustrated with hatching in FIG. 4 are all enabled at once. At the time of the above enabling operation, the memory cell array 1 having the redundant memory cells and the memory cell array 6 having no redundant memory cells are paired. Similarly, the memory cell array 11 equipped with the redundant memory cells and the memory cell array 16 equipped with no redundant memory cells are paired. The memory cell arrays thus enabled are located at different rows and columns. The number of memory cell arrays and the number of memory cells in each of the memory cell arrays are not limited to the above-mentioned numbers, but an arbitrary number of memory cell arrays and an arbitrary number of memory cells in each memory cell array can be employed.

In each of the memory cell arrays thus enabled, data stored in all the memory cells selected by the sub word lines extending from the sub word decoders are output to the corresponding sense amplifiers. In the present embodiment, 32 bits (8 bits×4 arrays) of data are all read at once from the memory cells and are supplied to the corresponding sense amplifiers.

As shown in FIGS. 4 and 5, the data latched in the sense amplifier groups 17–20 are read from the sense amplifiers selected by decoding the column select signals (CL) arranged along the sides of the memory cell arrays 1–16, and are then output via the global data buses (such as GDB00X, GDB00Z) extending above the memory cell arrays 1–16. Referring to FIG. 6, when the memory cell arrays 1 and 6, for example, are enabled, the data latched in the sense amplifiers selected by the column select lines are read to the signal lines GDB00–GDB15 each paired, and are then supplied to a global data bus amplifiers (GDBAMP) 31.

If a fault exists in any of the data buses GDB00–GDB07 such as a fault of a memory cell or a defective column select signal, the faulty column select line corresponding to the faulty data bus is replaced by the column select line which selects the redundant cell 21. That is, if a defective data bus is selected, the redundant cell 21 is selected by decoding the address indicative of the defective data bus. Thus, the memory circuit can be saved from the fault. For example, if there is a fault in the memory cell array 1 in the case where the memory cell arrays 1 and 6 are enabled, data latched in the redundant sense amplifier is read to a data bus RGDB00, and is then output to a redundant data bus amplifier RGDBAMP.

If there is a fault in any of the data buses GDB08–GDB15 associated with the memory cell array 6 which is in the enabled state and has no redundant memory cells, the column select line corresponding to the faulty data bus is replaced by the column select line which selects the redundant cell 21, so that the memory circuit can be saved from the above fault. Thus, as in the case where a fault exists in any of the data buses associated with the memory cell array 1, the data latched in the redundant sense amplifier is read to the redundant data bus RGDB00 and is then output to the redundant data bus amplifier RGDBAMP.

The data latched in the data bus amplifiers 31 are supplied to selector circuits 32a, 32b, . . . via a main data bus MDB and a redundant data bus RMDB. The selector circuits 32a, 32b, . . . are provided to the respective lines of the main data bus MDB. The redundant data bus RMDB are connected to all the selector circuits 32a, 32b, . . .

When there is no fault in the data buses associated with the memory cell arrays 1 and 6, each of the selector circuits 32a, 32b, . . . selects the corresponding data bus, as indicated by a symbol "A" shown in FIG. 7. If there is a fault in any of the data buses associated with either the memory cell array 1 or the memory cell array 6, for example, if the data bus GDB00 is defective, the selector circuit 32a selects the redundant data bus RGDB00, that is, the redundant data bus RMDB connected to the redundant data bus amplifier RGDBAMP.

The data selected by the selector circuits 32a, 32b, . . . are stored in sense buffers 33a, 33b, . . . , respectively. Each of the sense buffers 33a, 33b, . . . stores a number of bits corresponding to the burst length of the memory circuit. When the burst length is equal to, for example, four, each of the sense buffers 33a, 33b, . . . stores 4-bit parallel data.

The parallel data output from the sense buffers 33a, 33b, . . . are converted into serial data by parallel-to-serial converter circuits 34a, 34b, . . . , respectively. Then, the serial data thus obtained are buffered by output buffers 35a, 35b, . . . , and are then output to the outside of the memory circuit.

The first embodiment of the present invention can be summarized as follows. The memory cell arrays have a relatively reduced size. The main word lines extending from the main word decoder are provided to the respective columns and memory cell arrays to be all enabled at once are selected in the distributed fashion. Thus, each word line has a reduced load. Further, in the distributed fashion, the memory cell array having the redundant memory cell and the memory cell array having no redundant memory cell are enabled together. In other words, the redundant memory cell can be used to save the memory cell array having no redundant memory cell. Hence, the high redundant efficiency can be obtained without increasing the chip area.

Figure 1:
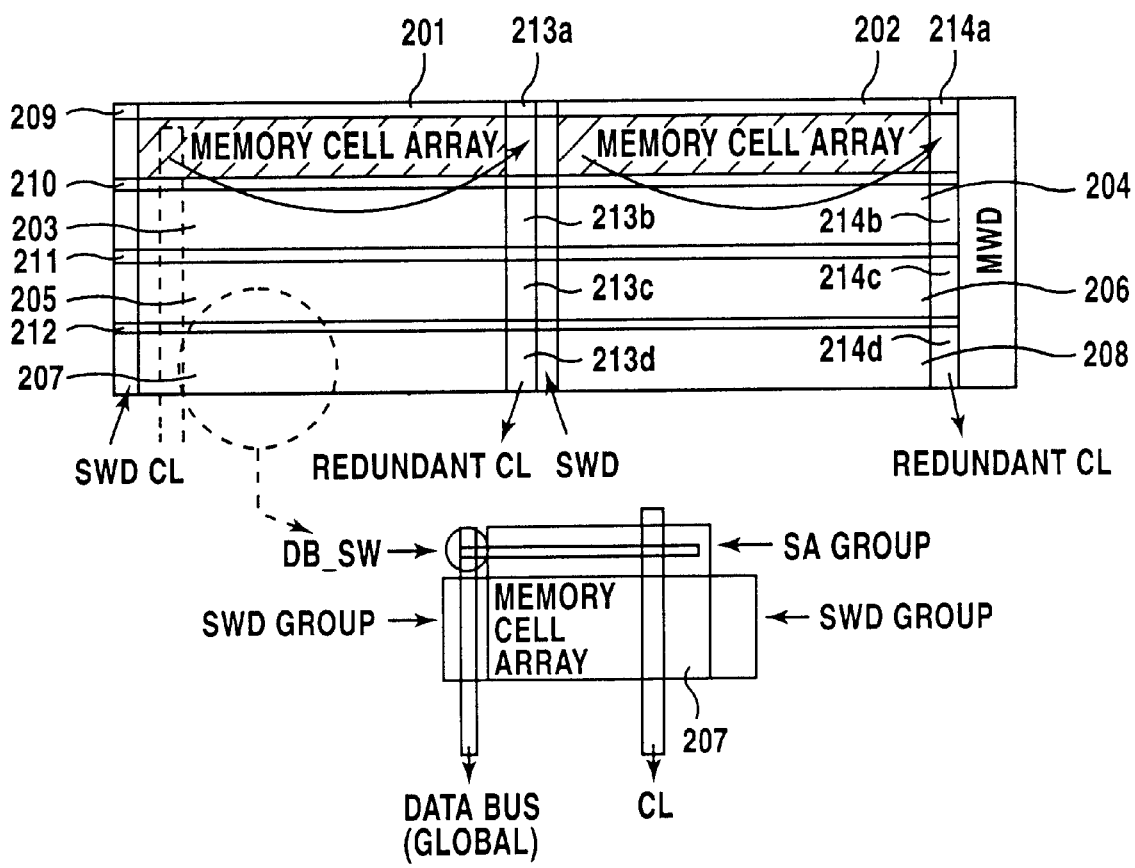
FIG. 1 is a block diagram of a conventional semiconductor memory circuit.
Figure 2:
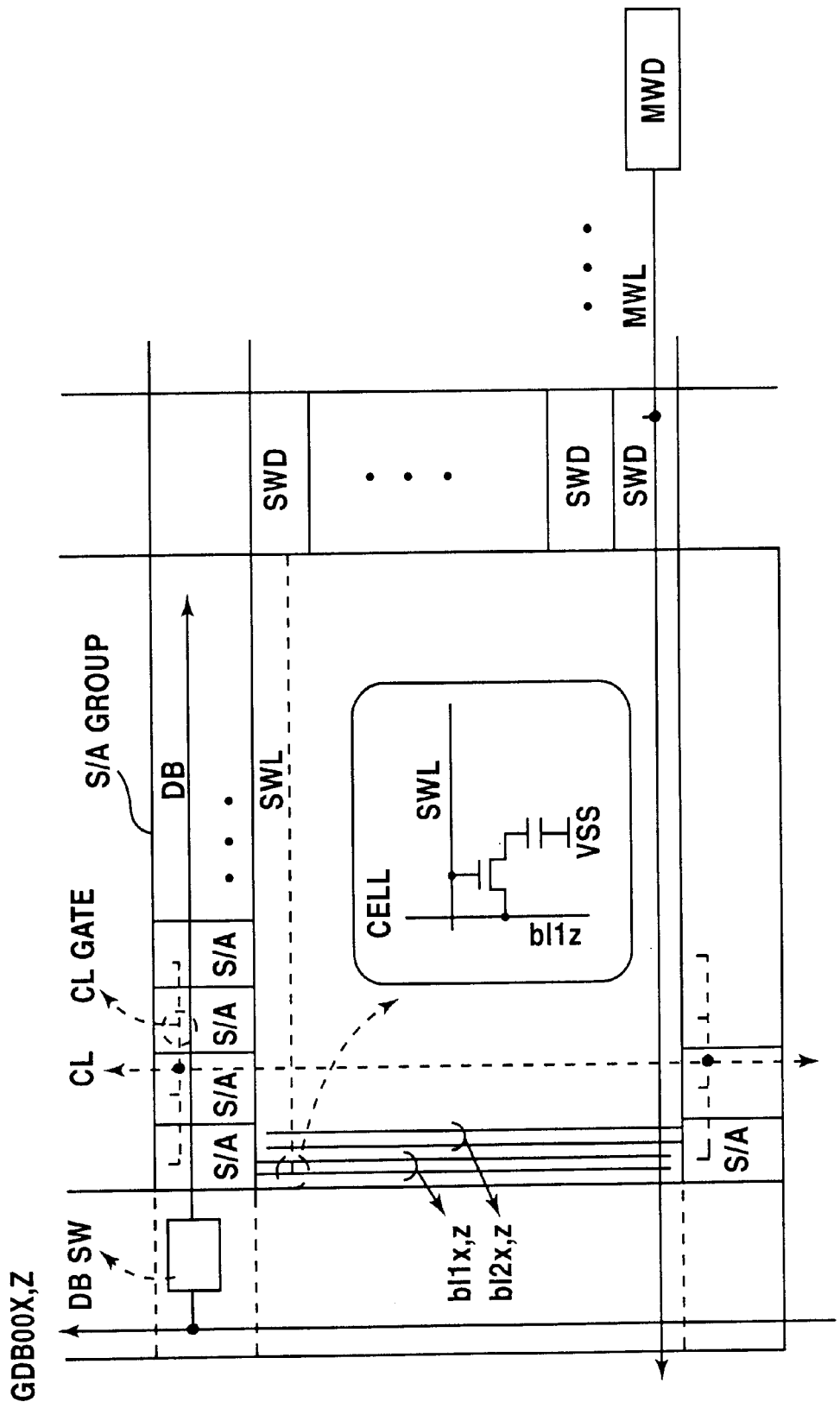
FIG. 2 is an enlarged block diagram of a part of the circuit shown in FIG. 1.
Figure 3:
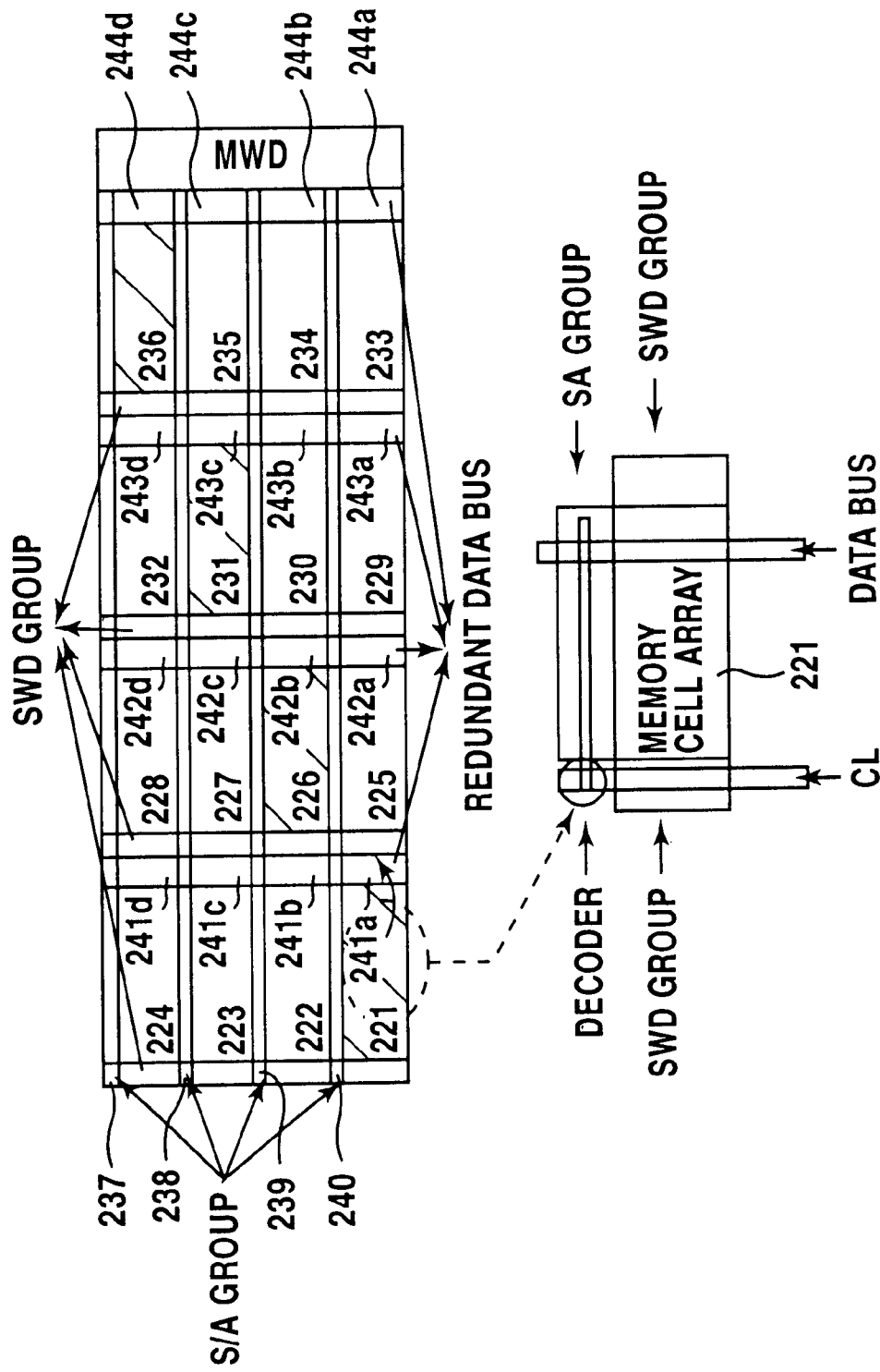
FIG. 3 is a block diagram of an improvement in the circuit shown in FIG. 1.
Figure 8:
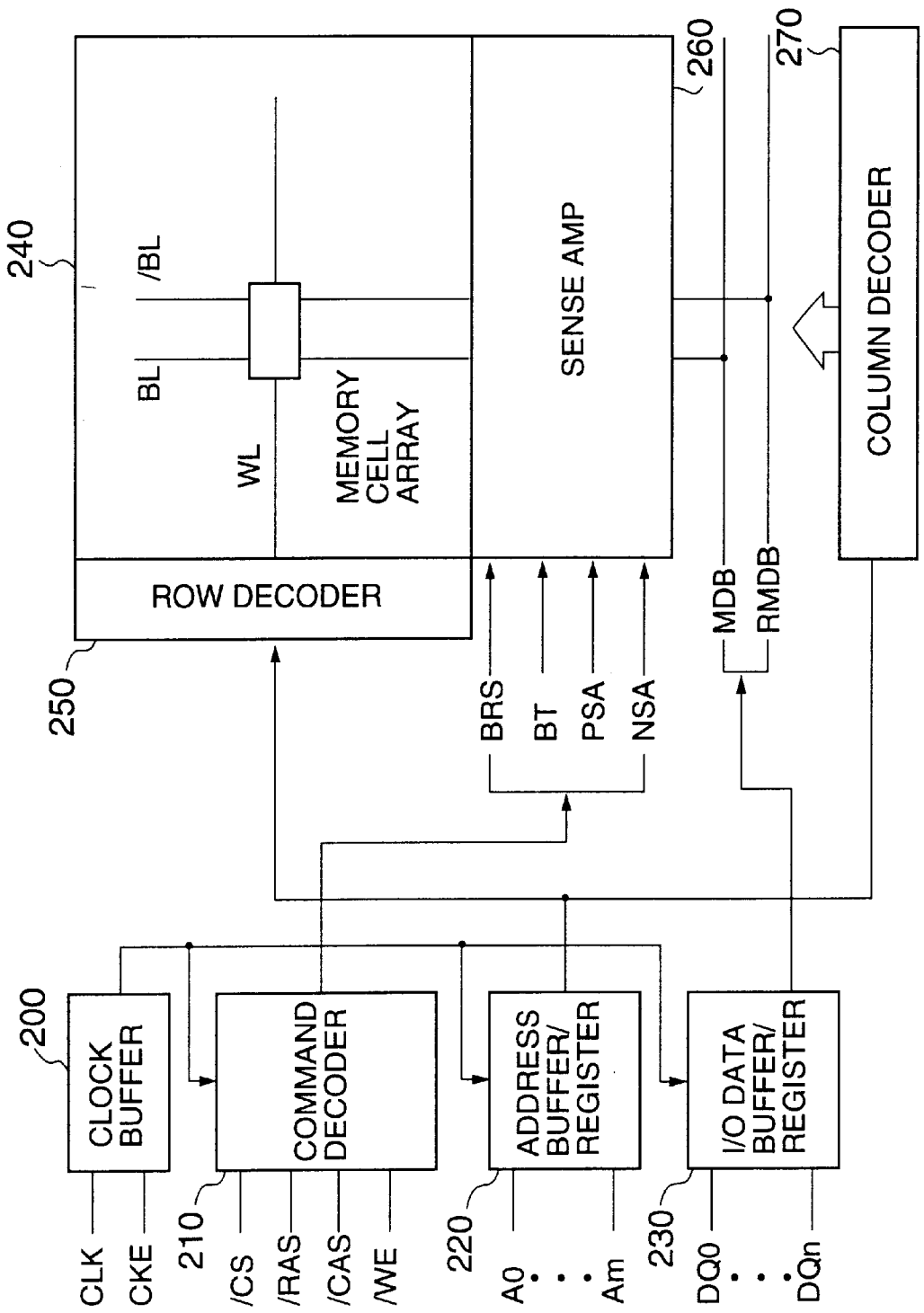
FIG. 8 is a block diagram of an example of the entire structure of the semiconductor device of the present invention.

FIG. 8 is a block diagram schematically illustrating the entire structure of the semiconductor memory circuit having the arrangement shown in FIGS. 4 through 7. A memory cell array block 240, a row decoder block 250, a sense amplifier block 260, and a column decoder block 270 are arranged as shown in FIGS. 3 and 4. More particularly, the memory cell array block 240 includes the memory cell arrays 1–16 and the redundant memory cells 21–28 shown in FIG. 4. The row decoder block 250 includes the main word decoder MWD and the sub word decoders SWD. The sense amplifier block 260 includes the sense amplifier groups 17–20. The column decoder block 270 includes column decoders such as CL_Dec shown in FIG. 5. Further, the data bus amplifiers GDBAMP and the redundant data bus amplifiers RGDBAMP shown in FIGS. 6 and 7 are located in the block 260.

The semiconductor memory circuit shown in FIG. 8 includes a clock buffer 200, a command decoder 210, an address buffer/register 220, and an I/O buffer/register block 230. The block 230 includes the selector circuits 32a, 32b, . . . , the sense buffers 33a, 33b, . . . , the parallel-to-serial converter circuits 34a, 34b, . . . , and the output buffers 35a, 35b, . . . , shown in FIG. 7.

The clock buffer 200 receives a clock signal CLK and a clock enable signal CKE from the outside of the memory device or circuit, and generates internal clock signals necessary to operate the internal circuits of the memory circuit. The internal clock signals thus generated are supplied to, for example, the command decoder 210, the address buffer/register 220, and the I/O data buffer/register block 230.

The command decoder 210 externally receives a chip select signal /CS, a row address strobe signal /RAS, a column address strobe signal /CAS, and a write enable signal /WE, and generates, therefrom, various control signals necessary to operate the internal circuits. Examples of the control signals thus generated are a bit line reset signal BRS, a transfer control signal BT, and sense amplifier control signals NSA and PSA. These signals are used as will be described later.

The address buffer/register 220 decodes an address signal consisting of bits A0–Am externally supplied to the memory circuit, and produces a row address signal and a column address signal therefrom. The row address signal is supplied to the main word decoder MWD.

Figure 9:
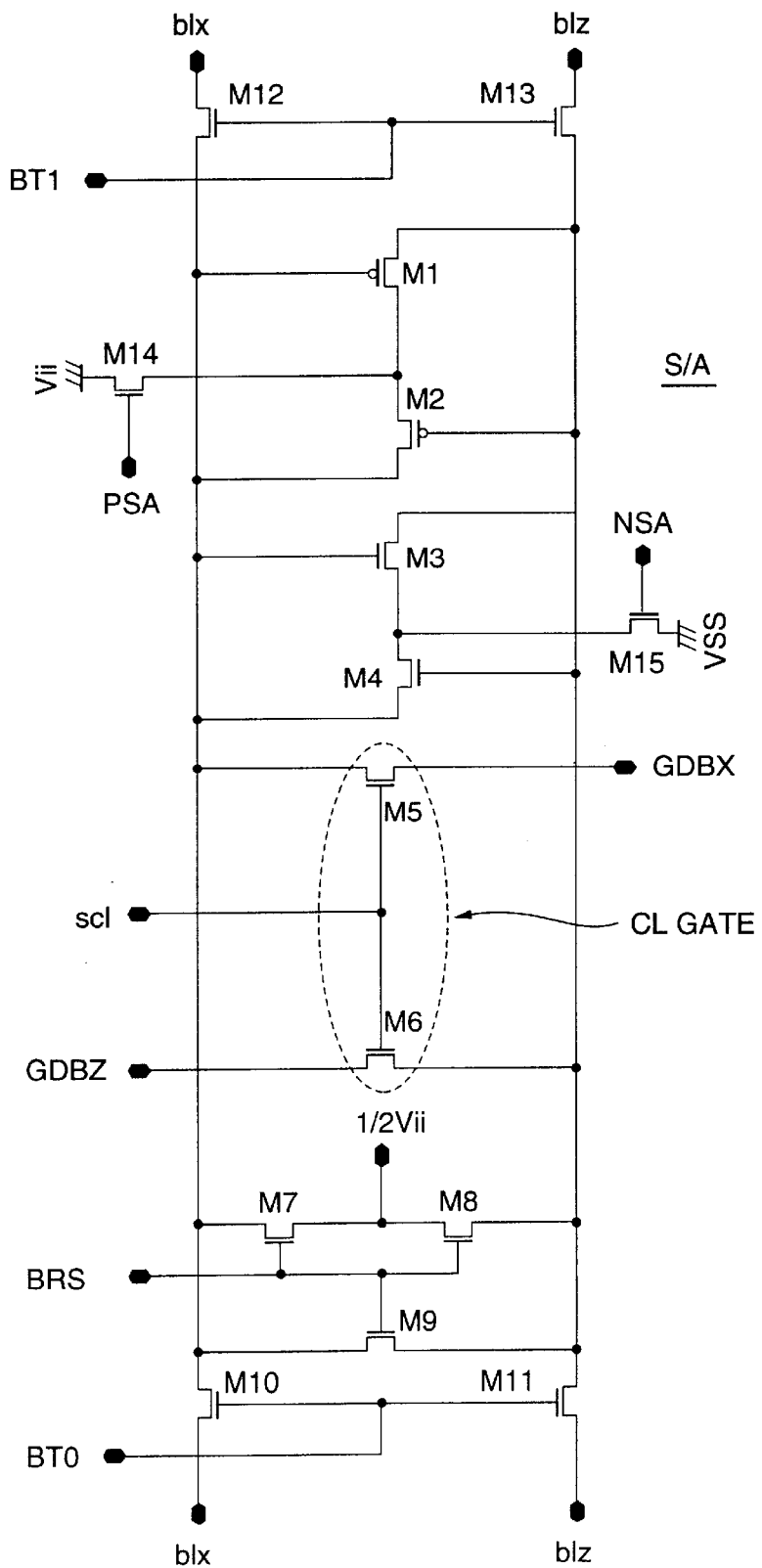
FIG. 9 is a circuit diagram of a sense amplifier and its peripheral circuits.

FIG. 9 is a circuit diagram of the sense amplifier S/A. The sense amplifier S/A senses data on a pair of bit lines blx and blz and outputs the sensed data to a pair of global data bus lines GDBX and GDBZ. The sense amplifier S/A includes a latch circuit made up of P-channel transistors M1 and M2 and N-channel transistors M3 and M4. The latch circuit is enabled and disabled by the sense amplifier control signals PSA and NSA supplied from the command decoder 210 shown in FIG. 8. Transistors M5 and M6 form a column gate. When the corresponding column select signal scl obtained by decoding the address signal by the column decoder 270 switches to the high level, the transistors M5 and M6 are turned ON, so that the bit lines blx and blz are connected to the global data bus lines GDBX and GDBZ. Transistors M7–M9 are used to reset the bit lines blx and blz to a (½)Vii where Vii denotes a power supply voltage. The transistors M7–M9 are turned ON in response to the bit line reset signal BRS supplied from the command decoder 210 shown in FIG. 8. Transistors M10 and M11 form a transfer gate responsive to a transfer control signal BT0 (a part of BT shown in FIG. 8) from the command decoder 210. Similarly, transistors M12 and M13 form a transfer gate responsive to a transfer control signal BT1 (another part of BT) from the command decoder 210.

Figure 10:
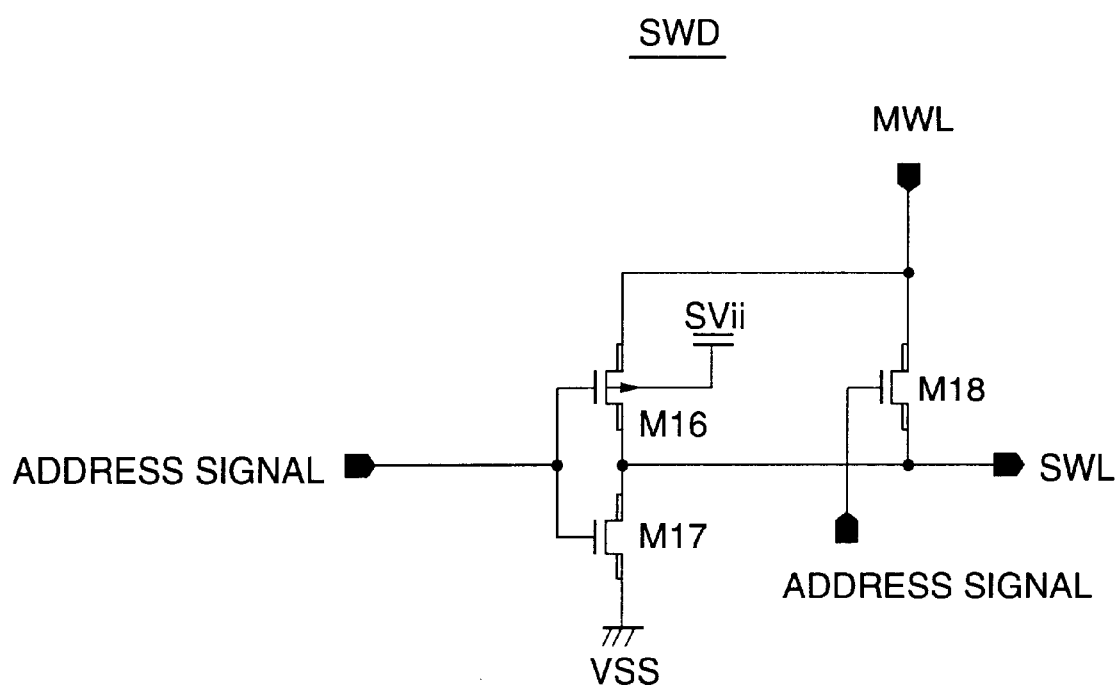
FIG. 10 is a circuit diagram of a sub word decoder.

FIG. 10 is a circuit diagram of the sub word decoder SWD. A corresponding one of bits of the decoded row address signal is applied to an inverter made up of transistors M16 and M17. An inverted version of the address bit is applied to a transistor M18. The source of the transistor M16 and the drain of the transistor M18 are connected to the corresponding main word line MWL. When the signal applied to the gate of the transistor M18 is high, the main word line MWL is connected to the sub word line SWL via the transistor M18. At this time, the main word line MWL is also connected to the sub word line SWL via the transistor M16. The back gate of the transistor M16 is supplied with a power supply voltage svii different from the aforementioned power supply voltage vii.

Figure 11:
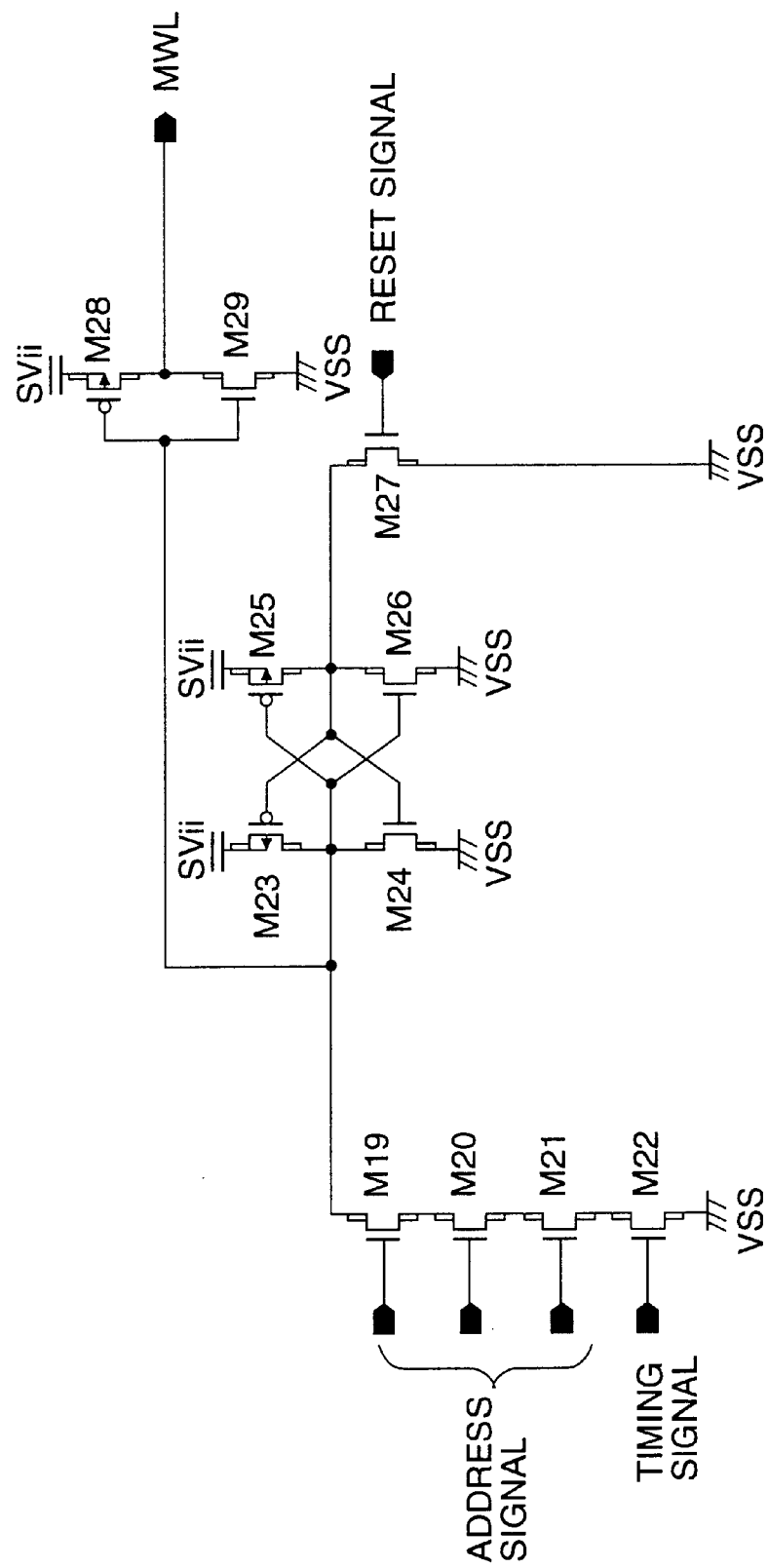
FIG. 11 is a circuit diagram of a main word decoder.

FIG. 11 is a circuit diagram of the main word decoder MWD, and more particularly illustrates a circuit associated to one main word line MWL. That is, the same circuits as shown in FIG. 11 are provided to the respective main word lines.

Transistors M19–M22 are connected in series, and three related bits of the decoded row address are applied to the gates of the transistors M19–M21. A timing signal supplied from the command decoder 210 shown in FIG. 8 is applied to the gate of the transistor M22. The drain of the transistor M19 is coupled to the main word line MWL via an inverter made up of transistors M28 and M29 and a latch circuit made up of transistors M23–M26. The latch circuit is grounded via a transistor M27 which is controlled by a reset signal supplied from the command decoder 210. When the three address bits turn ON the respective transistors M19–M21 and the timing signal is applied to the transistor M22, the main word line MWL is selected and set to the voltage svii by the inverter made up of the transistors M28 and M29. In response to the reset signal applied to the transistor M27, the latch circuit inverts the state of the inverter, which thus sets the main word line MWL to the low level (disabled).

Figure 12:
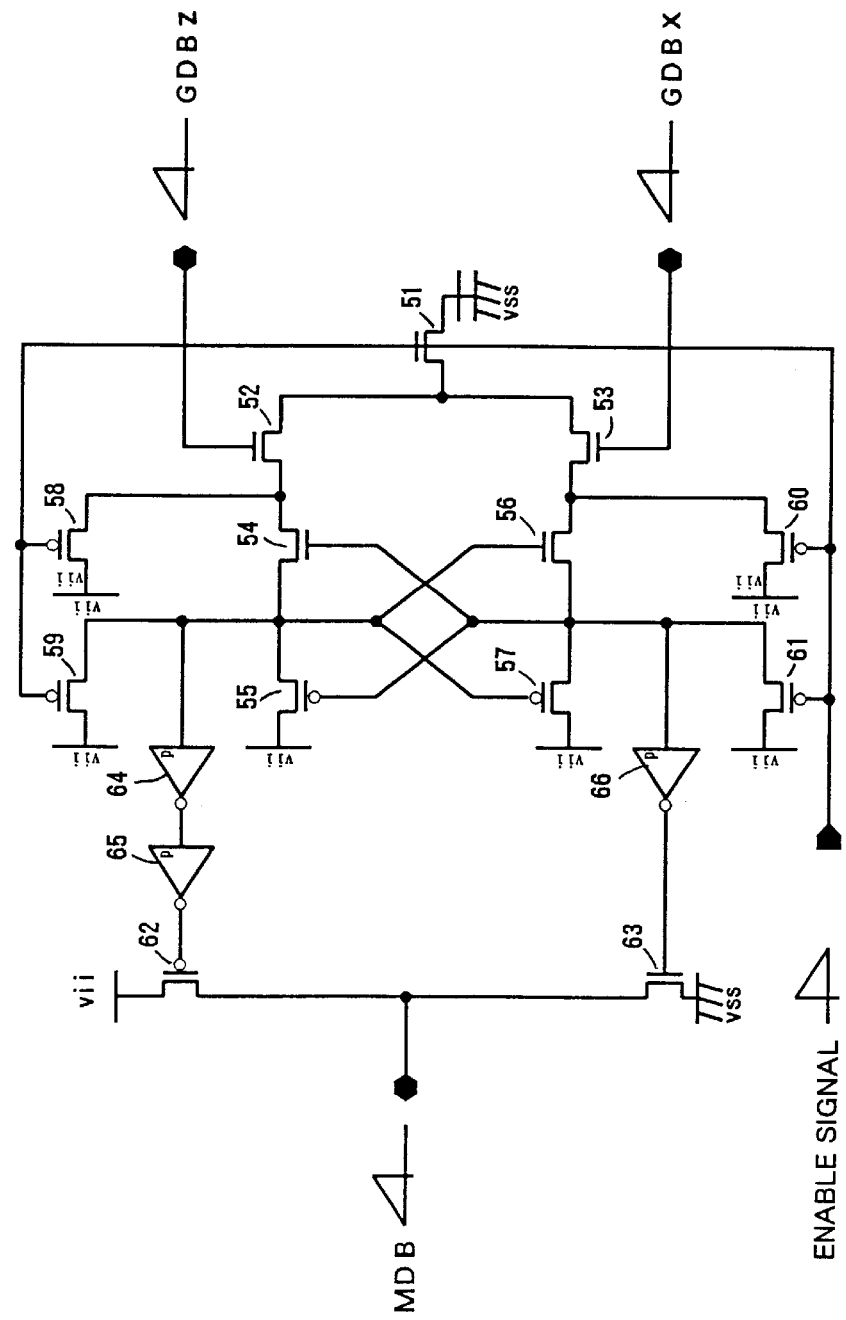
FIG. 12 is a circuit diagram of a global data bus amplifier.

FIG. 12 is a circuit diagram of the global data bus amplifier GDBAMP. As shown, the amplifier GDBAMP includes transistors 51–63 and inverters 64–66. When an enable signal is at a low level (in the disabled state), the transistors 59 and 61 are ON and the transistors 62 and 63 are OFF. Hence, data carried over the pair of global data bus lines GDBX and GDBZ are not transferred to the main data bus line MDB, which is set to the high-impedance state. On the other hand, when the enable signal is at the high level (in the enabled state), the transistor 51 is ON. At this time, when the data carried over the pair of global data bus lines GDBX and GDBZ is high (that is, the GDBZ and GDBX are respectively high and low), the transistors 52, 54 and 62 are ON, and the main data bus line MDB is set to the high level. When the data signal carried over the pair of global data bus lines GDBX and GDBZ is low (that is, the GDBZ and GDBX are respectively low and high), the transistors 53, 56 and 63 are ON, and the main data bus line MDB is set to the low level.

The redundant global data bus amplifier RGDBAMP has the same configuration as illustrated in FIG. 12.

Figure 13:
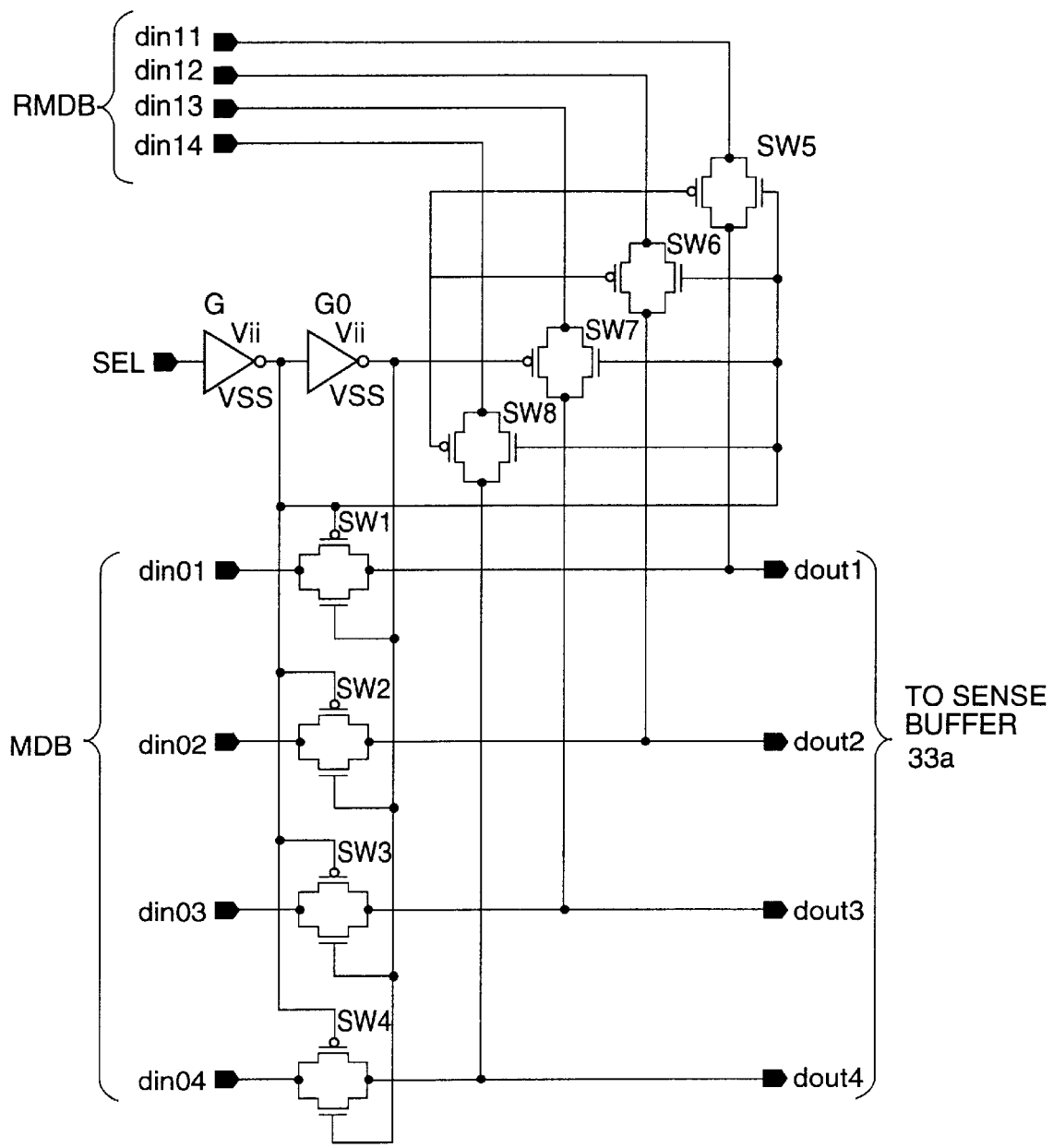
FIG. 13 is a circuit diagram of a data bus select circuit shown in FIG. 7.

FIG. 13 is a circuit diagram of the selector circuit 32a. The circuit configuration shown in FIG. 13 is used when the burst length is equal to four. The selector circuit 32a has four switches SW1–SW4, each of which is made up of a P-channel transistor and an N-channel transistor. The switches SW1–SW4 are connected to four lines din01–din04 of the main data bus MDB. A select signal SET is applied to the gates of the P-channel transistors of the switches SW1–SW4 via an inverter G, and is applied to the gates of the N-channel transistors thereof via the inverter G and another inverter G0. Further, the selector circuit 32a has four switches SW5–SW8, each of which is made up of a P-channel transistor and an N-channel transistor. The switches SW5–SW8 are connected to four lines din11–din14 of the redundant data bus RMDB. The output signal of the inverter G is applied to the gates of the N-channel transistors of the switches SW5–SW8, and the output signal of the inverter G0 is applied to the gates of the P-channel transistors thereof.

When the select signal SEL is at the high level, the switches SW1–SW4 are opened, and the four lines din01–din04 of the main data bus MDB are connected to output lines dout1–dout4 of the sense amplifier 32a, which output lines are connected to the sense buffer 33a.

Figure 14:
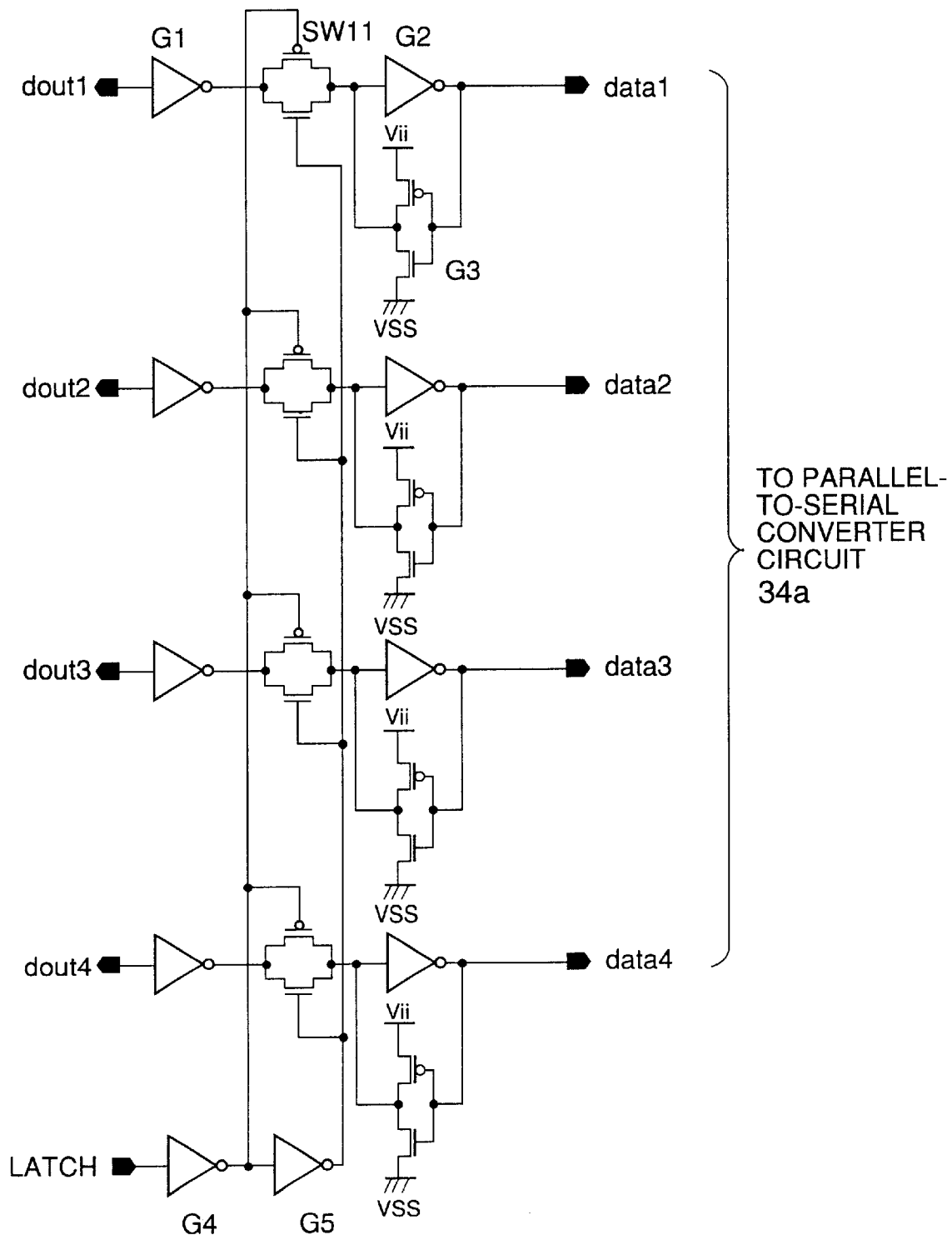
FIG. 14 is a circuit diagram of a sense buffer shown in FIG. 7.

FIG. 14 is a circuit diagram of the sense buffer circuit 33a. With respect to the output line dout1, there are provided inverters G1, G2 and G3, a switch SW11. The inverters G2 and G3 form a latch circuit. An output data line data1 extending from the output of the latch circuit is connected to the parallel-to-serial converter circuit 34a. The same circuit configuration as described above is provided to each of the output lines dout2–dout4. The switch SW11 is controlled based on a latch signal LATCH, which passes through inverters G4 and G5. The other switches corresponding to the switch SW11 are controlled in the same manner as the switch SW11. When the switch SW11 is opened, data on the output line dout1 passes through the inverter G1 and the switch SW11 and is then latched in the latch circuit made up of the inverters G2 and G3.

Figure 15:
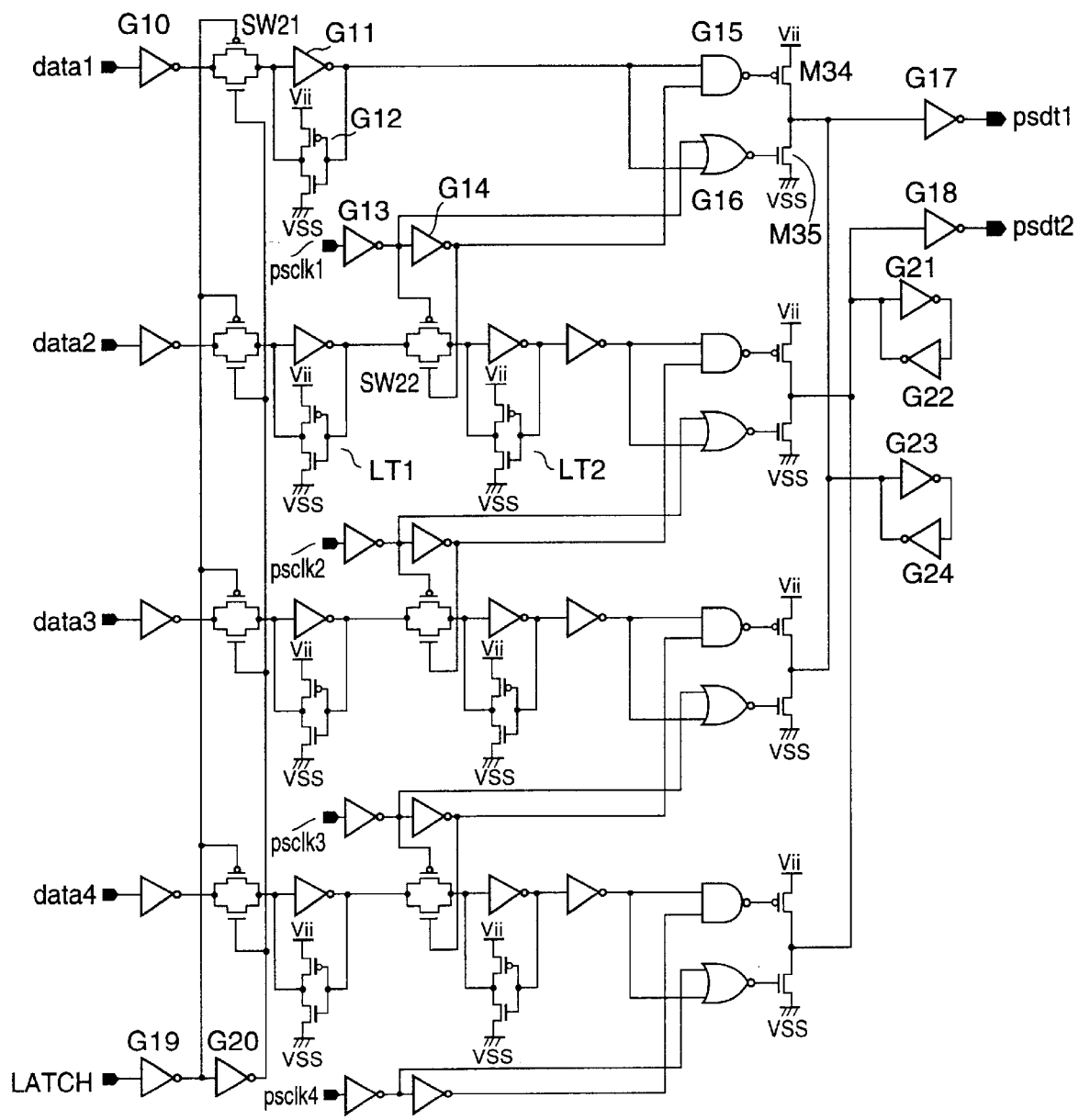
FIG. 15 is a circuit diagram of a parallel-to-serial converter circuit shown in FIG. 7.

FIG. 15 is a circuit diagram of the parallel-to-serial converter circuit 34a, which converts four data lines into two data lines. With respect to the data line data1, there are provided inverters G10–G14, a switch SW21, a NAND gate G15, a NOR gate G16, a P-channel transistor M34, and an N-channel transistor M35. The switch SW21 is controlled based on the latch signal LATCH, which passes through inverters G19 and G20. Data transferred over the data line data1 passes through the inverter G10 and the switch SW21, and is then latched in a latch circuit made up of the inverters G11 and G12. Then, the latched data is applied to the NAND gate G15 and the NOR gate G16. A clock signal psclk1 passes through the gate G13, and is applied to the NAND gate G15. The clock signal psck11 passing through the inverter G13 passes through the inverter G14, and is then applied to the NOR gate G16.

When the data latched in the latch circuit made up of the inverters G11 and G12 is "1" and the output signal of the gate G13 switches to the high level, the NAND gate G15 outputs the low-level signal, which turns ON the transistor M34. Hence, an output line psdt1 extending from an inverter G17 is set to the low level. At that time, the NOR gate G16 outputs the low-level signal, which turns OFF the transistor M35. When the data latched in the latch circuit is "0" and the output signal of the gate G13 switches to the low level, the NOR gate G16 outputs the high-level signal, which turns ON the transistor M35. Hence, the output line psdt1 is set to the high level. At this time, the NAND gate G15 outputs the high-level signal, which turns OFF the transistor M34.

Each of the circuit portions respectively provided to the data lines data2–data4 has two latch circuits LT1 and LT2 which are connected in series via a switch SW22. The output signals of the inverters G13 and 14 control the switch SW22. The circuit portions respectively provided to the data lines data2–data4 are respectively supplied with clock signals psclk2, psclk3 and psclk4. The clock signals psclk1 and psclk3 have a phase relationship in which one of the circuit portions provided to the data lines data1 and data3 is enabled and the other is disabled. Similarly, the clock signals psclk2 and psclk4 have a phase relationship in which one of the circuit portions provided to the data lines data2 and data4 is enabled and the other is disabled. The data lines data2 and data4 are converted into a data line psdt2 extending from an inverter G18. Similarly, the data lines data1 and data3 are converted into the data line psdt1.

A latch circuit made up of inverters G21 and G22 is connected to the inverter G18, and a latch circuit made up of inverters G23 and G24 is connected to the inverter G17. The data which are output from the circuit portions related to the data lines data1 and data3 are latched in the latch circuit formed by the inverters G23 and G24. Similarly, the data which are output from the circuit portions related to the data lines data2 and data4 are latched in the latch circuit formed by the inverters G21 and G22.

Figure 16:
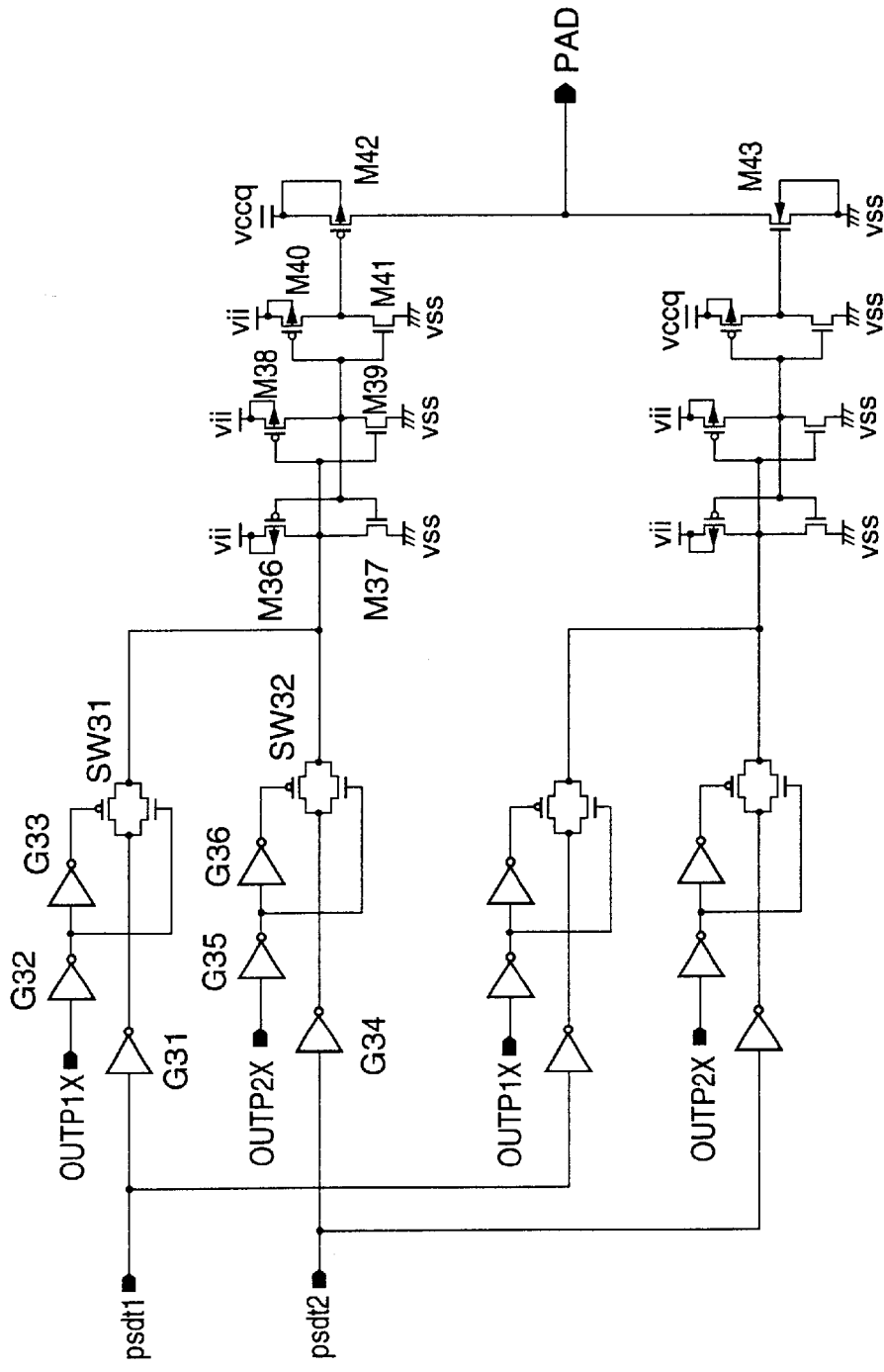
FIG. 16 is a circuit diagram of an output circuit shown in FIG. 7.

FIG. 16 is a circuit diagram of the output buffer 35a, which functions to convert the two data lines psdt1 and psdt2 extending from the parallel-to-serial converter circuit 34a into a single data line connected to a pad for external connection. The output buffer 35a includes two identical circuit portions, one of which circuit portions includes inverters G31–G36, switches SW31 and SW32, and transistors M36–M41. Transistors M42 and M43 are provided at the final stage of the output buffer 35a.

The data transferred over the data line psdt1 passes through the inverter G31 and the switch SW31, and is applied to a flip-flop made up of the transistors M36–M39. Similarly, the data transferred over the data line psdt2 passes through the inverter G34 and the switch SW32, and is applied to the flip-flop. The switch SW31 is controlled by a timing signal OUTP1X, and the switch SW32 is controlled by a timing signal OUTP2X. The timing signals OUTP1X and OUTP2X have a phase difference of 180 degrees. When the data on the data line psdt1 or psdt2 is "0", the transistor M42 is driven. In contrast, when data on the data line pasdt1 or psdt2 is "1", the transistor M43 is driven.

A description will now be given of a second embodiment of the present invention which is of a multiple-bit output type.

Figure 17:
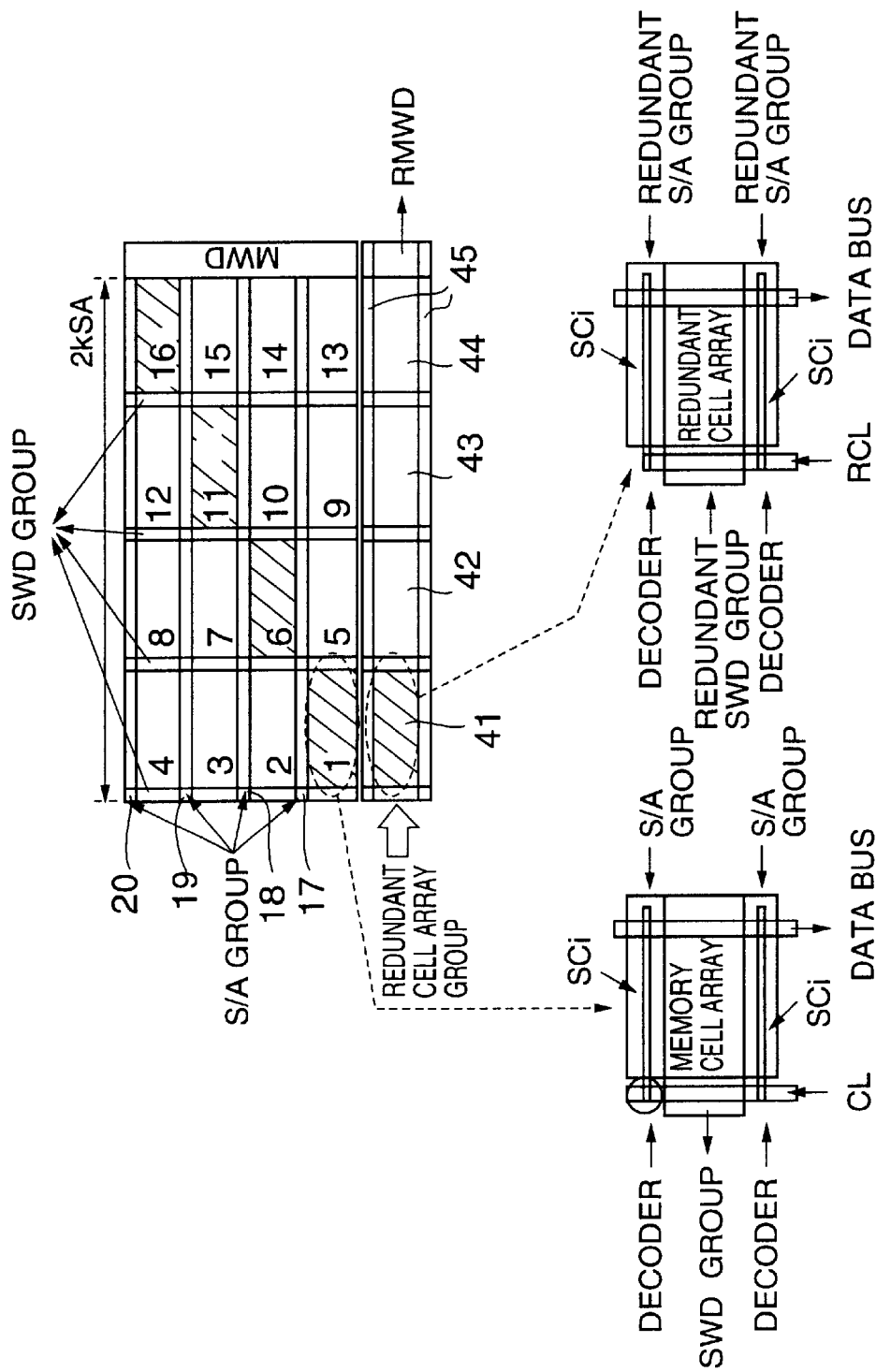
FIG. 17 is a block diagram of a structure of a memory cell array employed in a second embodiment of the present invention.

A semiconductor memory circuit shown in FIG. 17 includes 16 memory cell arrays 1–16 and sense amplifier groups 17–20 as in the case of the first embodiment of the present invention.

The semiconductor memory device is equipped with redundant memory cell arrays 41–44 provided to the respective rows of the 16 memory cell arrays 1–16, and sense amplifier groups 45 which receive and latch data read from the redundant memory cell arrays 41–44. In the second embodiment of the present invention, the four redundant memory cell arrays 41–44 save the memory circuit from a fault of the data buses of the 16 memory cell arrays 1–16. Each of the memory cell arrays 1–16 and the redundant memory cell arrays 41–44 includes memory cells arrayed in eight rows and four columns. The number of memory cell arrays and the number of memory cells in each of the memory cell arrays are not limited to the above-mentioned numbers, but an arbitrary number of memory cell arrays and an arbitrary number of memory cells in each memory cell array can be employed taking into account, for example, the memory capacity and the memory cell structure. Further, the structure of the redundant memory cell arrays can be altered taking into account, for example, the memory capacity and the memory cell structure.

Figure 18:
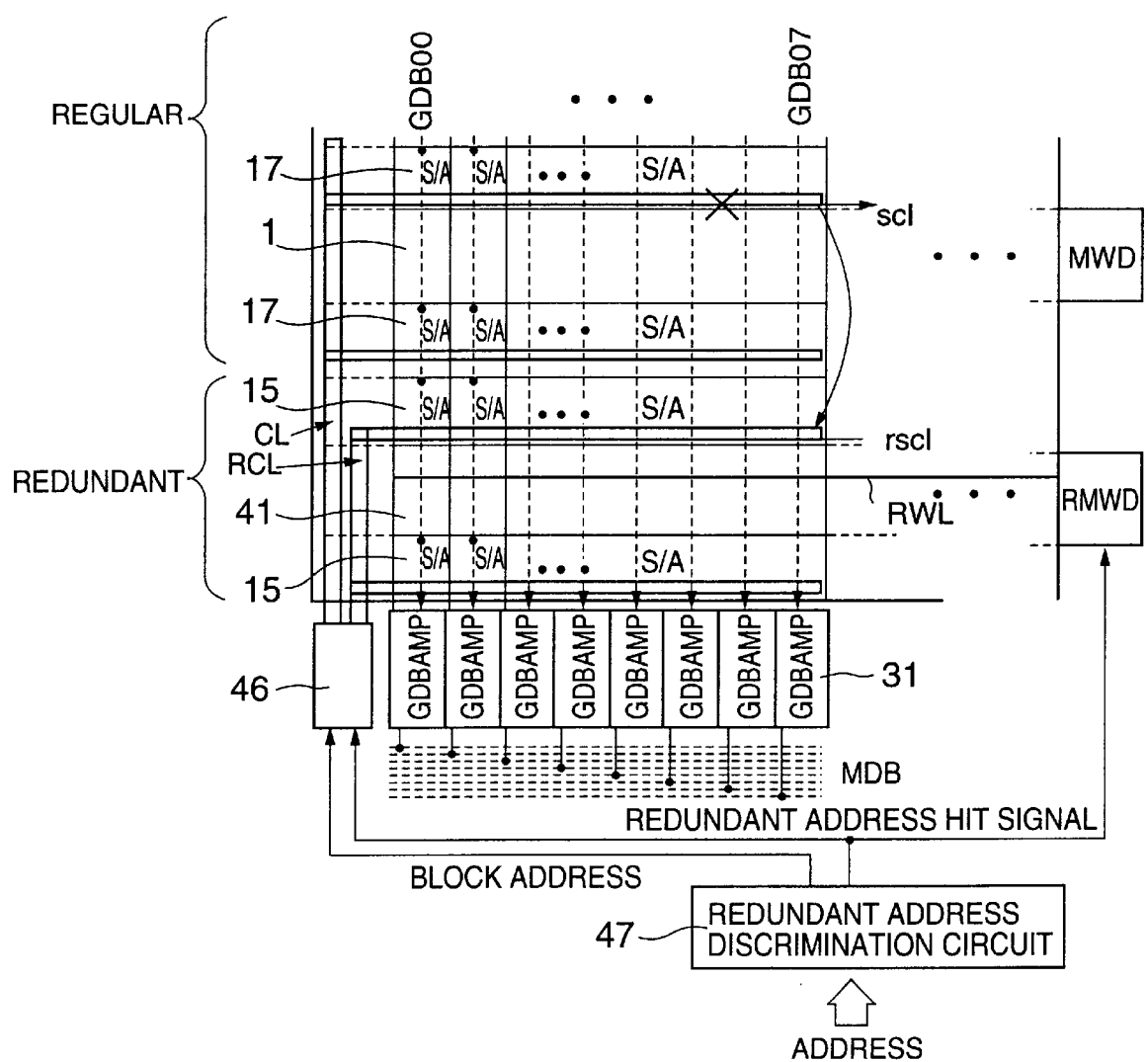
FIG. 18 is a block diagram which illustrates, in detail, of the memory cell array and its peripheral circuits used in the second embodiment of the present invention.

A description will now be given, with reference to FIGS. 17 and 18, of an operation of the semiconductor memory circuit according to the second embodiment of the present invention. FIG. 18 illustrates the cell array structure and a data output structure of the memory circuit.

As in the case of the first embodiment of the present invention, four memory cell arrays located in the different rows and columns selected by the four main word lines extending from the main word decoder are all enabled at once. For example, the four memory cell arrays illustrated with hatching shown in FIG. 17 are all activated at once.

Data stored in all the memory cells selected by the sub word lines extending from the sub word decoders are output to the sense amplifiers. In the second embodiment, data of 8 bits×4 (the number of memory cell arrays enabled) selected by the four sub word lines are all read at once and are supplied to the sense amplifiers. When the burst length is equal to four, 32 bits of data are successively read in the order of selection of the sub word lines.

As shown in FIG. 17, data held in the sense amplifier groups 17–20 are read from the sense amplifiers selected by decoding of the column select lines CL arranged along the sides of the memory cell arrays, and are output via the global data bus GDB. For example, as shown in FIG. 18, in the case data held in the sense amplifier group 17 is read to the global data bus lines GDB00–GDB07 in the state in which the memory cell array 1 is in the enabled state, a column select circuit 46 drives the column select line CL so that the sense amplifier group 17 selected by the column select circuit 46 is coupled to the global data bus lines GDB00–GDB07. Hence, the data latched in the selected sense amplifiers are read to the global data bus lines GDB00–GDB07 and are then transferred to the corresponding global data bus amplifiers 31.

If there is a fault related to any of the global data bus lines GDB00–GDB07 as indicated by a symbol "X" in FIG. 18, the redundant memory cell array 41 of the same row as the memory cell array 1 is enabled instead of the memory cell array 1, so that the memory circuit can be saved from such a fault. That is, the signal line scl related to the fault and coupled to the column select line CL is replaced by a redundant signal line rscl coupled to a redundant column select line RCL, as indicated by an arrow shown in FIG. 18. That is, the column select line CL is replaced by the redundant column select line RCL. In contrast, the aforementioned first embodiment of the present invention replaces only the defective global data bus line GDB by the redundant global data bus line RGDB.

The replacement of the defective global data bus lines with the redundant global data bus lines is controlled by a redundant address discrimination circuit 47 shown in FIG. 18. The redundant address discrimination circuit 47 stores the address of the memory cell array 1 related to the defective global data bus line GDB as a redundant address. The redundant address discrimination circuit 47 compares the redundant address with the external address, and determines whether both the addresses coincide with each other. If the addresses do not coincide with each other, the circuit 47 notifies the column select circuit 46 that there is no fault. On the contrary, if the external address coincides with the redundant address, the circuit 47 notifies, by a redundant address hit signal, the column select circuit 46 of the occurrence of a fault and the address indicative of any one of the redundant memory cell arrays 41–44.

Upon receiving the above notifications and a block address, the column select circuit 46 drives the column select line CL or the redundant column select line RCL as will be described later. The redundant main word decoder RMWD drives a redundant main word line RMWD upon receiving the redundant address hit signal from the discrimination circuit 47. Then, the data latched in the sense amplifiers selected by the driven column select line are read to the global data bus lines GDB00–GDB07, and are then transferred to the corresponding global data bus amplifiers 31. A wired-OR connection is employed to connect the global data bus lines GDB00–GDB07 connected to the sense amplifier group 17 and the redundant sense amplifier groups 45, and thus a particular control is not needed. The above description is directed to a fault related to the global data bus lines GDB of the sense amplifier group 17. Similarly, the memory circuit can be saved from a fault related to the global data bus lines GDB of the other sense amplifier groups 17.

The data received by the global sense amplifier groups 31 are stored in sense buffers (which correspond to the sense buffers 33a, 33b, . . . shown in FIG. 7)) as in the case of the first embodiment of the present invention. At that time, each of the sense buffers stores the number of bits based on the burst length. For example, when the burst length is equal to four, 4-bit parallel data is stored in each of the sense buffers.

The parallel data output from the sense buffers are converted into parallel-to-serial converter circuits (which correspond to the parallel-to-serial converter circuits 34a, 34b, . . . shown in FIG. 7), and are then output to the outside of the memory circuit via output buffers (which correspond to the output buffers 35a, 35b, . . . shown in FIG. 7).

The second embodiment of the present invention can be summarized as follows. The memory cell arrays have a relatively reduced size. The main word lines extending from the main word decoder are provided to the respective columns and memory cell arrays to be enabled at once are selected in the distributed fashion. Thus, each word line has a reduced load. Further, the redundant memory cell arrays 41–44 are provided to the respective rows in order to minimize an increase of the chip area without degrading the redundant efficiency. That is, if one of the regular memory cell arrays is defective, the redundant memory cell array is substituted for the defective memory cell array, which inhibits the defective memory cell array from operating. Hence, the high redundant efficiency can be obtained without increasing the chip area.

Figure 19:
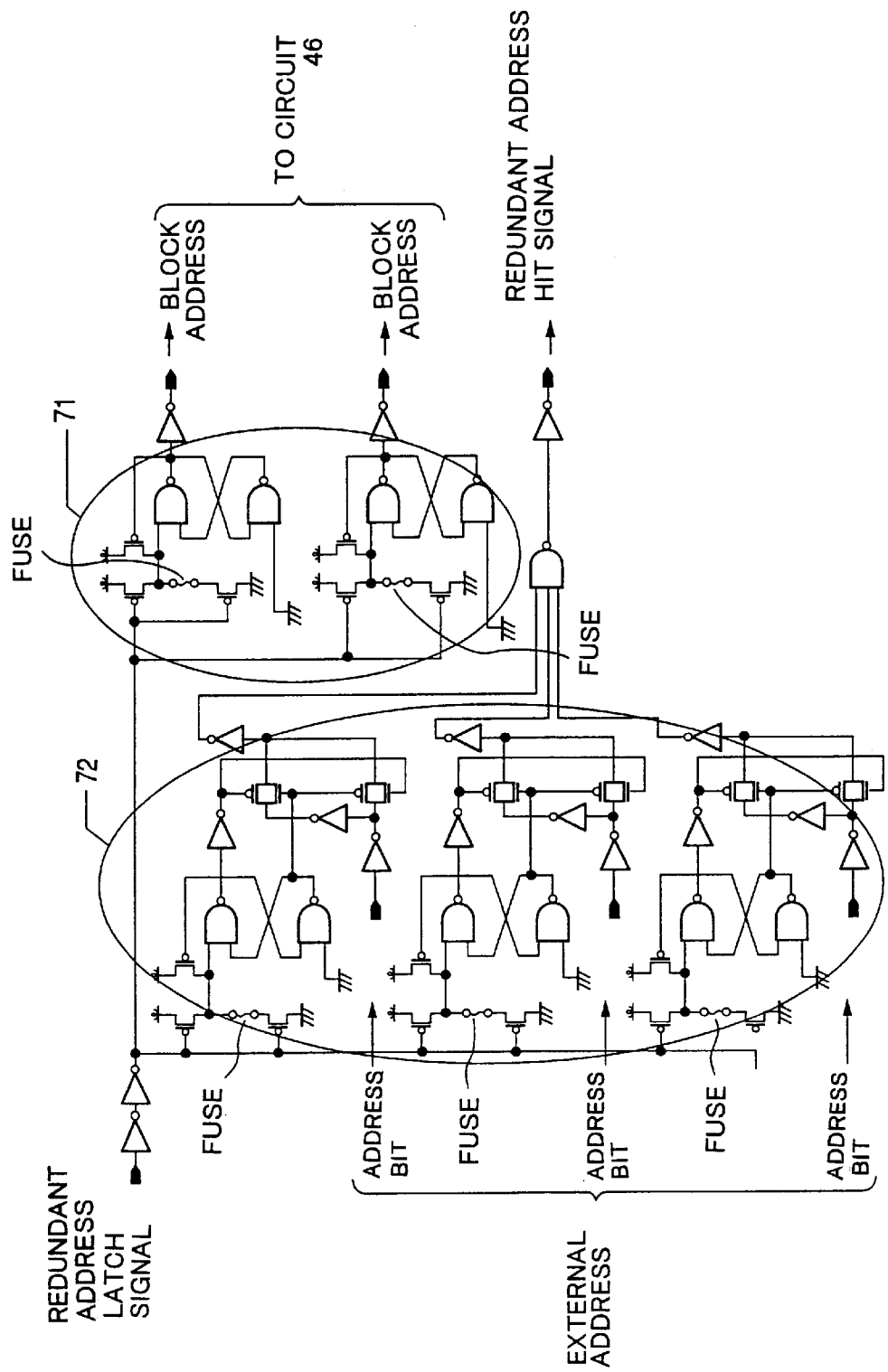
FIG. 19 is a circuit diagram of a redundant address discrimination circuit shown in FIG. 18.

FIG. 19 is a circuit diagram of the redundant address discrimination circuit 47 used in the second embodiment of the present invention. The discrimination circuit 47 is mainly made up of a redundant address comparator part 72 and a block address memory part 71. The redundant address discrimination circuit 47 stores the address of the defective memory cell array (the redundant address) and the address (block address) of the redundant memory cell array to be substituted for the defective one. Means for memorizing the above address information is implemented by, for example, a fuse. More particularly, the redundant address and the block address are programmed by selectively disconnecting corresponding fuses.

For example, if the memory cell array 1 has a fault, the address of the array 1 is programmed as the redundant address, which is compared with the external address. If the external address coincides with the redundant address, the redundant address hit signal is generated by the redundant address comparator part 72, as shown in FIG. 19. If the external address does not coincide with the redundant address, the redundant address hit signal is not generated.

In the case where the external address coincides with the redundant address, a block address signal for selecting one of the four redundant memory cell arrays 41–44 is generated by the block address memory part 71. The four redundant memory cell arrays 41–44 can be specified by a two-bit block address. For example, the redundant memory cell arrays 41, 42, 43 and 44 can be specified by '00', '01', '10' and '11', respectively. In the case shown in FIG. 19, two fuses of the redundant address comparator part 72 are not disconnected. Hence, the block address '00' is generated by the comparator circuit 72.

Figure 20A:
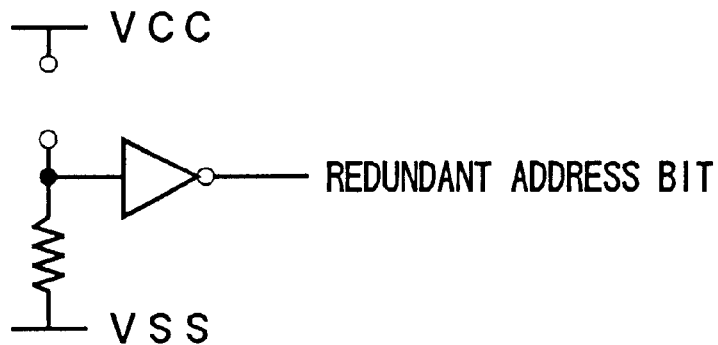
FIGS. 20A, 20B and 20C respectively show examples of setting of a redundant address.
Figure 20B:
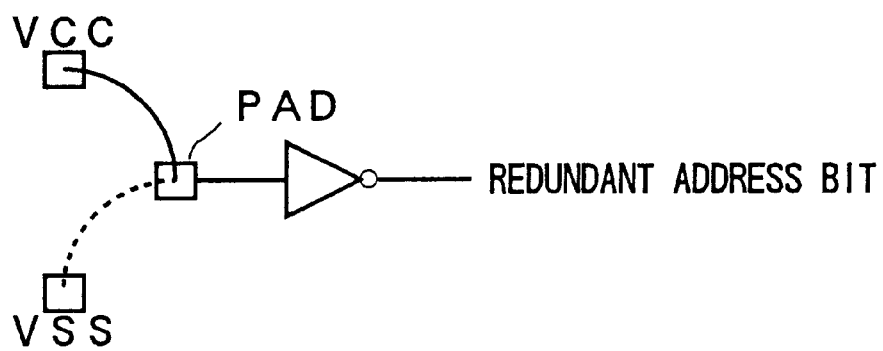
Figure 20C:
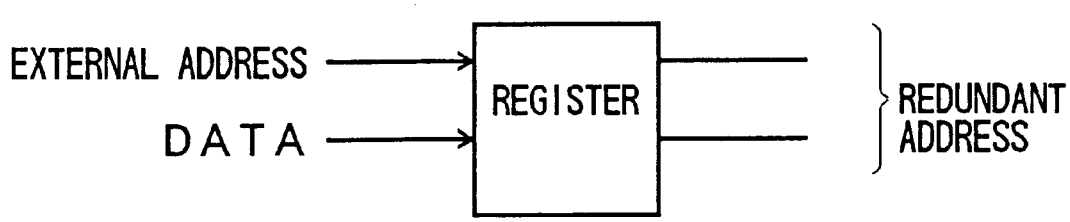

The setting of the redundant address and the block address is implemented by selectively disconnecting the fuses. However, the address setting is not limited to the above but can be implemented by other means such as shown in FIGS. 20A, 20B and 20C. FIG. 20A shows a first method of a switch and a high-resistance resistor. The circuit shown in FIG. 20A can set one of the two bits of the block address. By setting the states of the two switches, the block address indicating one of the redundant memory cell arrays 41–44 can be generated. FIG. 20B shows a second method using a bonding wire connected to a pad. The circuit of FIG. 20B can set one of the two bits of the block address. By setting each of the two bonding wires to a VCC line or a VSS line, the two-bit block address can be programmed. FIG. 20C shows a third method using a register. One of the address bits and one-bit data are stored in the register, from which the two-bit block address can be read.

Figure 21:
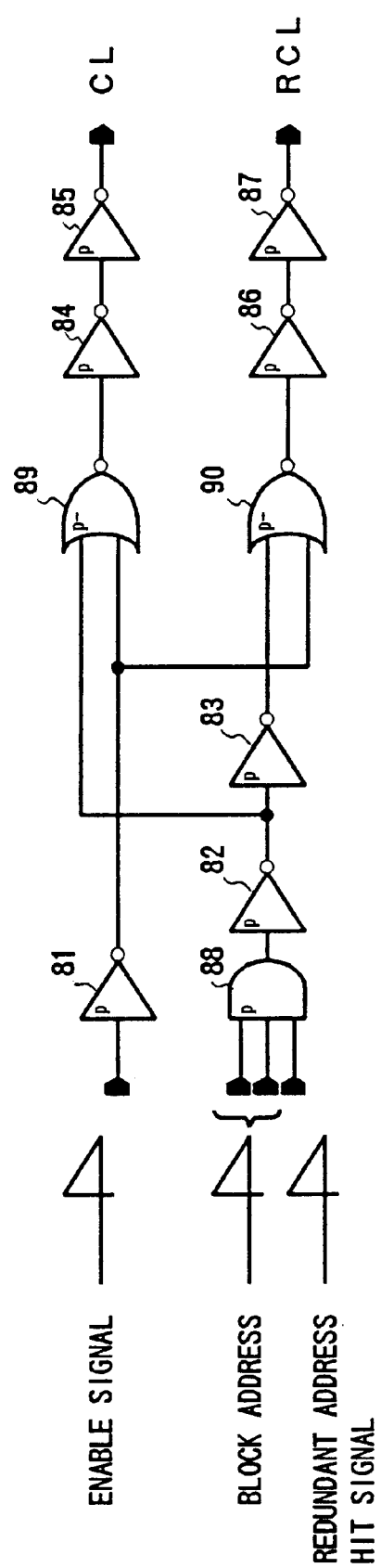
FIG. 21 is a block diagram of a column select circuit shown in FIG. 18.

FIG. 21 is a circuit diagram of the column select circuit 46, which is made up of inverters 81–87, a NAND gate 88, and NOR gates 89 and 90. When an enable signal supplied from the command decoder 210 shown in FIG. 8 is at the low level, the NOR gates 89 and 90 mask the other signals, and the column select circuit 46 is in the disabled state. In contrast, when the enable signal is at the high level, the column select circuit 46 is in the enabled state. When the block address is '11' and the redundant address hit signal is high, the NAND gate 88 outputs the high-level signal, and the redundant column select line RCL is set to the high level (enabled). Thus, the redundant column memory cell array 44 is selected.

The NAND gate 88 is replaced by other logic gates in order to generate the other block addresses, namely, '00', '01' and '10'.

The present invention is not limited to the specifically disclosed embodiments, and variations and modifications may be made without departing from the scope of the present invention.

What is claimed is:

1. A semiconductor memory circuit comprising:
   a plurality of memory cell arrays arranged in rows and columns;
   a decoder circuit which selects a predetermined number of memory cell arrays from among the plurality of the memory cell arrays;
   sense amplifiers which sense data read from selected memory cell arrays; and
   redundant memory cell arrays respectively provided to the rows.

2. The semiconductor memory circuit as claimed in claim 1, wherein the selected memory cell arrays are located in mutually different rows and columns.

3. The semiconductor memory circuit as claimed in claim 1, wherein each of the sense amplifiers handles a number of bits corresponding to a burst length.

4. The semiconductor memory circuit as claimed in claim 1, wherein each of the redundant memory cell arrays can be substituted for any of the memory cell arrays located in the same row.

5. The semiconductor memory circuit as claimed in claim 1, comprising an address information memory circuit which stores an address of a defective memory cell array, the redundant memory cell arrays being selectively enabled based on the address of the defective memory cell arrays stored in the address information memory circuit.

6. The semiconductor memory circuit as claimed in claim 5, wherein the address information memory circuit comprises a programmable circuit in which the address of the defective memory cell array is programmed.

7. The semiconductor memory circuit as claimed it claim 5, wherein the address information memory circuit comprises a register in which the address of the defective memory cell array is externally supplied and is stored.

8. The semiconductor memory circuit as claimed in claim 5, wherein the address information memory circuit comprises one of a fuse or a switch which has a state based on the address of the defective memory cell array.

9. The semiconductor memory circuit as claimed in claim 5, wherein the address information memory circuit comprises a pad which is connected to one of two different potentials by a bonding wire on the basis of the address of the defective memory cell array.

10. The semiconductor memory circuit as claimed in claim 1, wherein the memory cell arrays and the corresponding one of the redundant memory cell arrays located in the same row are commonly connected to a data bus.

* * * * *